(12) United States Patent
Norte

(10) Patent No.: US 7,345,889 B1
(45) Date of Patent: Mar. 18, 2008

(54) METHOD AND SYSTEM FOR REDUCING RADIATED ENERGY EMISSIONS IN COMPUTATIONAL DEVICES

(75) Inventor: David Norte, Westminster, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 599 days.

(21) Appl. No.: 10/953,775

(22) Filed: Sep. 28, 2004

(51) Int. Cl.
  *H05K 1/11* (2006.01)
(52) U.S. Cl. ............... 361/794; 361/17; 361/830; 361/761; 361/763; 361/782; 361/766; 361/780; 361/818; 174/250; 174/255; 174/257; 174/261; 257/532; 257/724; 333/12
(58) Field of Classification Search ........ 361/794, 361/766, 782, 763, 761.17, 830; 174/255, 174/261, 250, 257; 257/532, 724; 333/185, 333/12
See application file for complete search history.

(56) References Cited

U.S. PATENT DOCUMENTS

| | | | | |
|---|---|---|---|---|
| 4,854,038 A * | 8/1989 | Wiley ..................... | 29/830 |
| 5,418,690 A * | 5/1995 | Conn et al. .............. | 361/794 |
| 6,215,076 B1 * | 4/2001 | Inagawa et al. .......... | 174/261 |
| 6,262,495 B1 * | 7/2001 | Yablonovitch et al. .... | 307/101 |
| 6,433,286 B1 * | 8/2002 | Doberenz .................. | 174/261 |
| 6,774,866 B2 * | 8/2004 | McKinzie et al. ......... | 343/909 |
| 6,914,334 B2 * | 7/2005 | Li et al. .................... | 257/752 |
| 6,975,489 B2 * | 12/2005 | Otsuka et al. ............. | 361/15 |
| 6,995,322 B2 * | 2/2006 | Chan et al. ............... | 174/262 |
| 2004/0102042 A1 * | 5/2004 | Worm et al. ............... | 438/689 |
| 2004/0150969 A1 * | 8/2004 | Chan et al. ............... | 361/792 |
| 2004/0183184 A1 * | 9/2004 | Libous et al. ............. | 257/690 |
| 2004/0207042 A1 * | 10/2004 | McCormack et al. ...... | 257/532 |
| 2006/0082980 A1 * | 4/2006 | Borland et al. ........... | 361/763 |

* cited by examiner

*Primary Examiner*—Dean A. Reichard
*Assistant Examiner*—Hoa C Nguyen
(74) *Attorney, Agent, or Firm*—Sheridan Ross P.C.

(57) ABSTRACT

A method and system for reducing the release of high frequency electromagnetic energy into the environment is disclosed, wherein local regions of distributed capacitance are embedded within a printed circuit board (PCB) and adjacent the PCB conductive traces act as low pass filters and thus increase the rise and/or fall times occurring on such traces. The present invention increases very short rise and/or fall times (e.g., 200 picoseconds or less) without degrading or detrimentally affecting other signal characteristics. The present invention does not substantially affect the voltage amplitude and does not affect the bit period when lengthening the rise and/or fall time. Also, the present invention does not induce any timing jitter that may cause synchronization problems within the system.

21 Claims, 25 Drawing Sheets

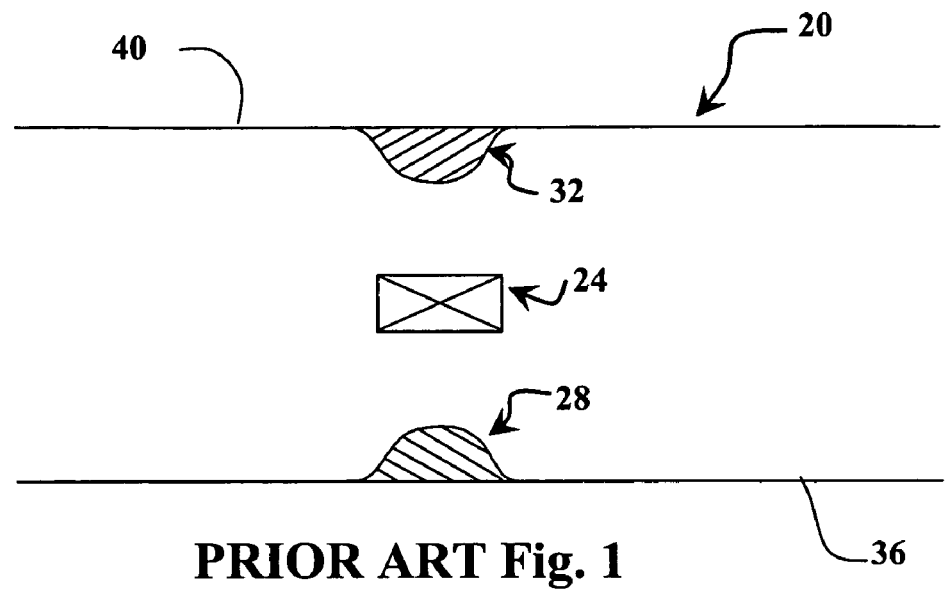
PRIOR ART Fig. 1
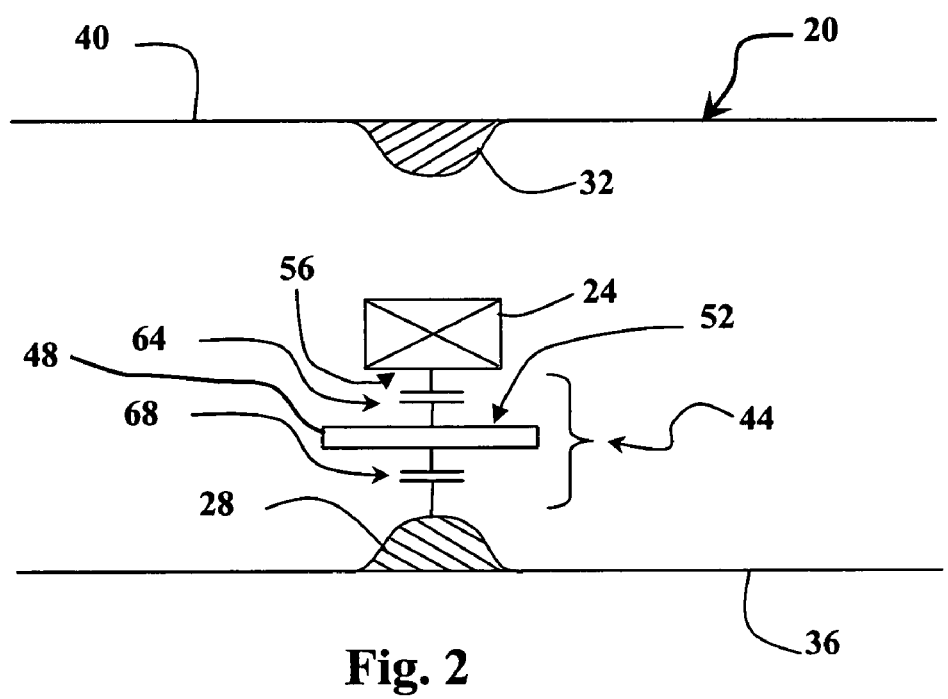
Fig. 2

Fig. 11B
Output Eye Pattern For 10 LRoCs With Cleakage = 0.184pF
(Rise Time = 187.5ps, 7.1% increase)
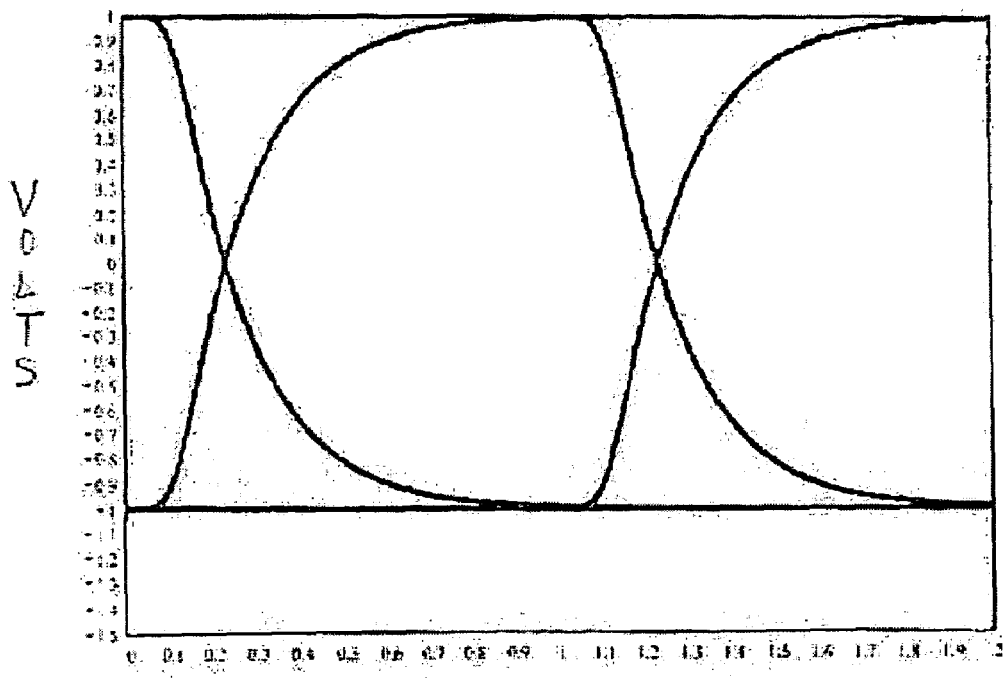
Input Eye Pattern, Rise Time = 175ps
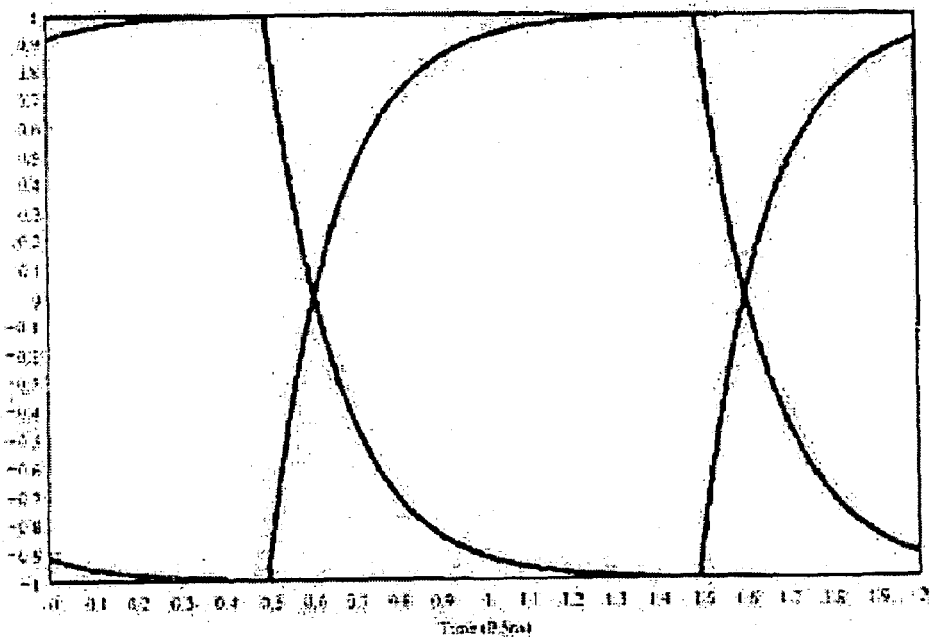
Fig. 11A Fig. 12B
Output Eye Pattern For 20 LRccs With Cleakage = 0.184pF
(Rise Time = 190ps, 8.8% increase)
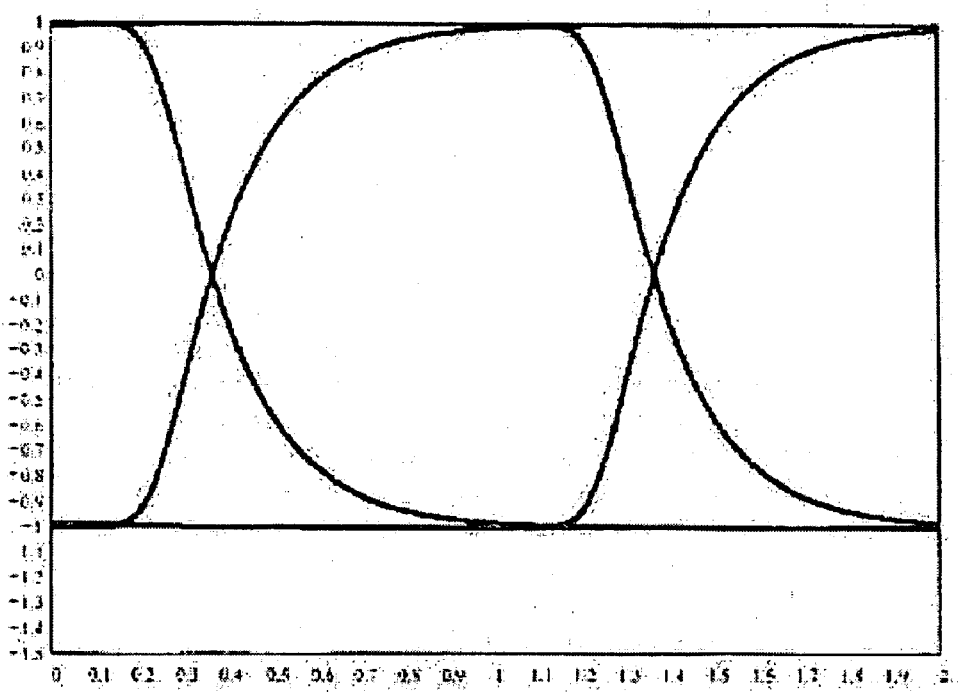
Input Eye Pattern, Rise Time = 175ps
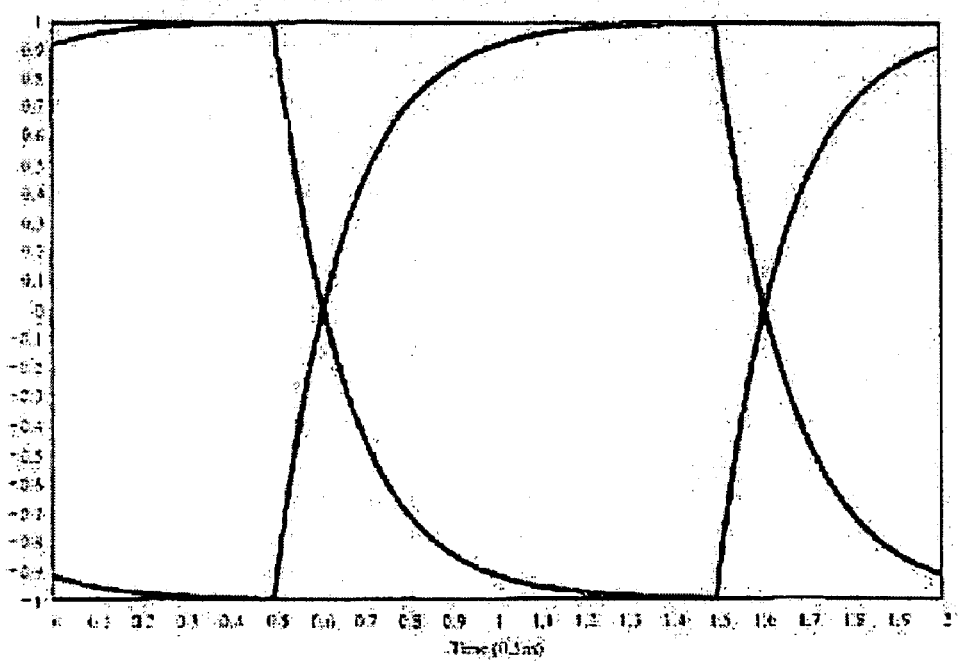
Fig. 12A Output Eye Pattern For 26 LRoCs With Cleakage = 0.184pF
(Rise Time = 195ps, 11.4% increase)

Input Eye Pattern, Rise Time = 175ps

Fig. 14B
Output Eye Pattern For 20 LRoCs With Cleakage = 0.283pF
(Rise Time = 212.5ps, 21.4% increase)
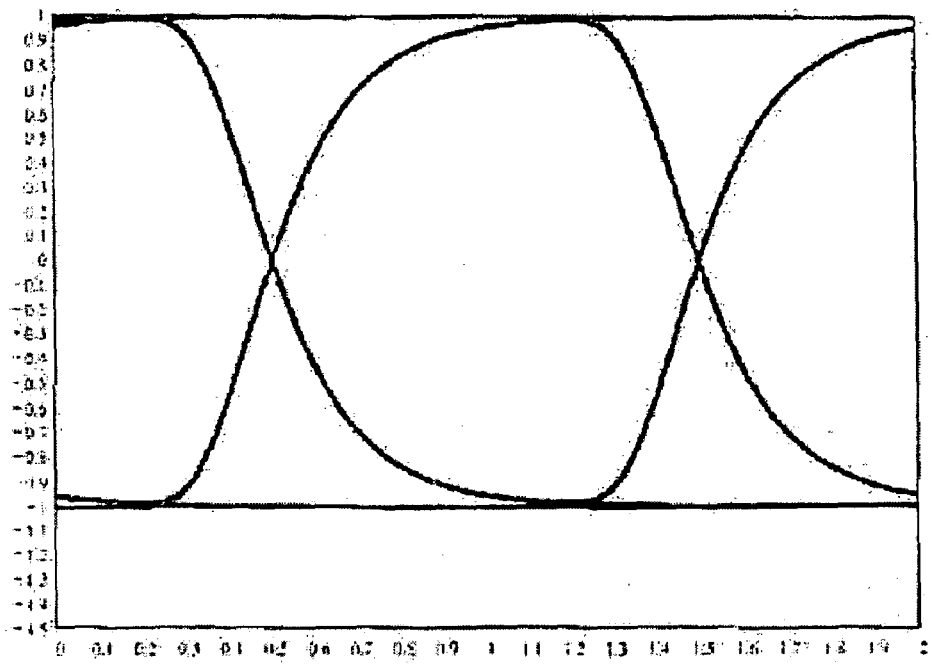
Input Eye Pattern, Rise Time = 175ps
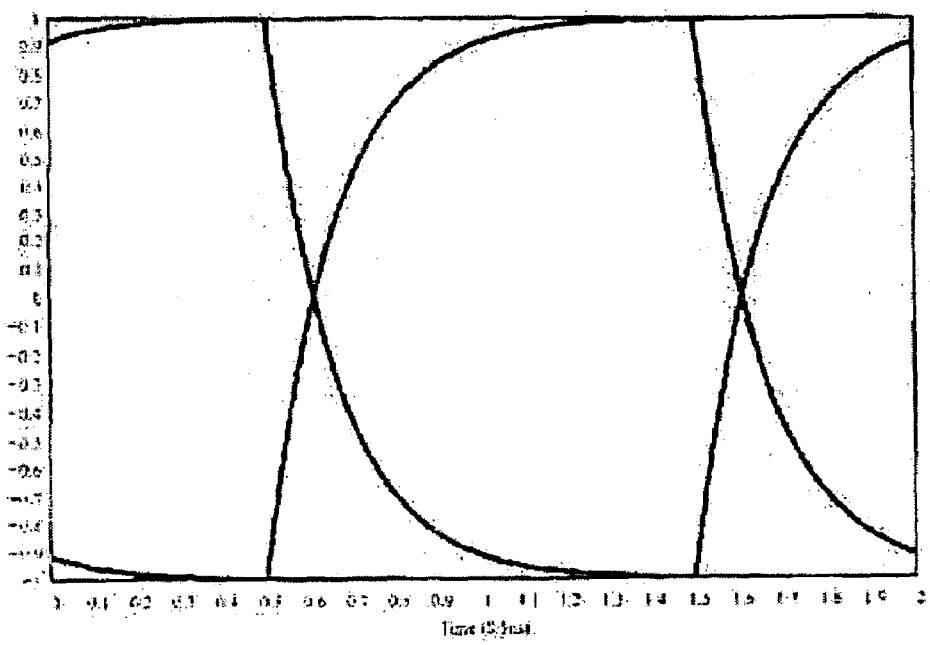
Fig 14A Fig. 15B
Output Eye Pattern For 26 LRoCs With Cleakage = 0.283pF
(Rise Time = 215ps, 23% increase)
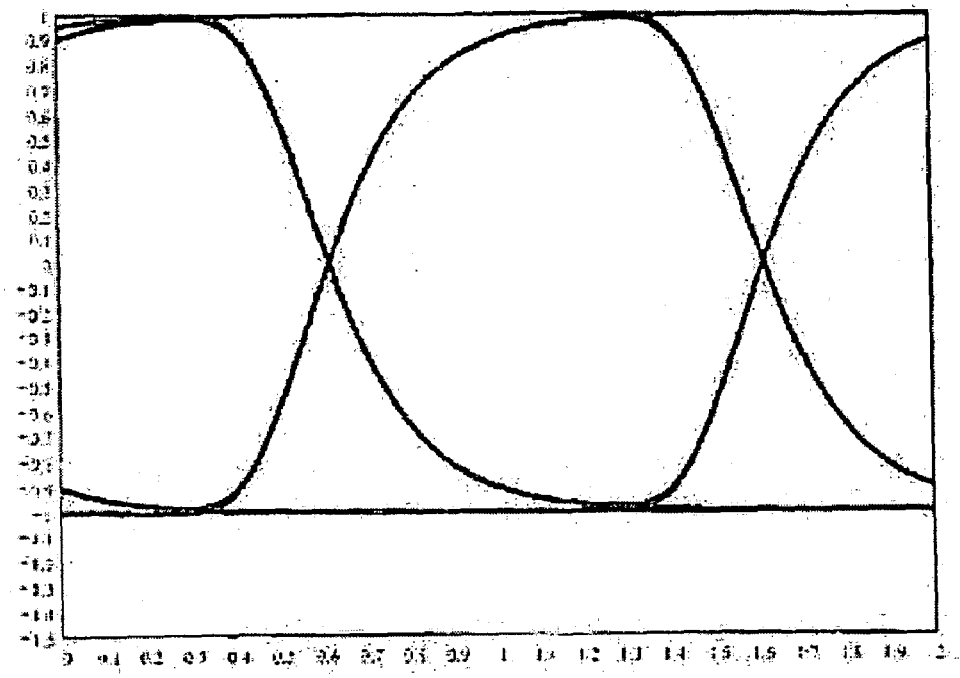
Input Eye Pattern, Rise Time = 175ps
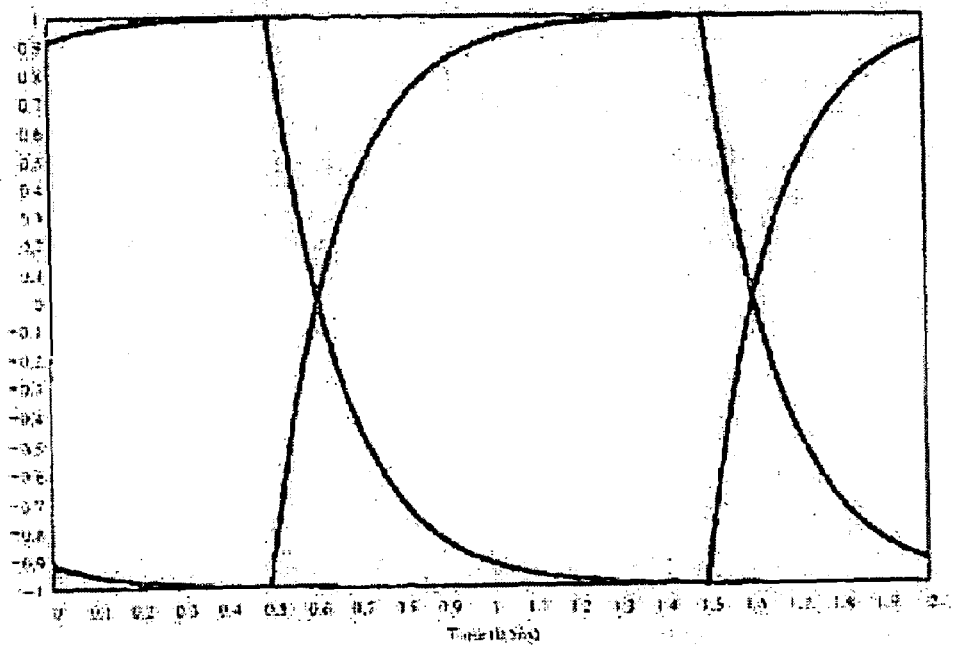
Fig 15A

Fig. 16B
Output Eye Pattern For 10 LROCs With Cleakage = 0.4pF
*(Rise Time = 210ps, 20% increase)*
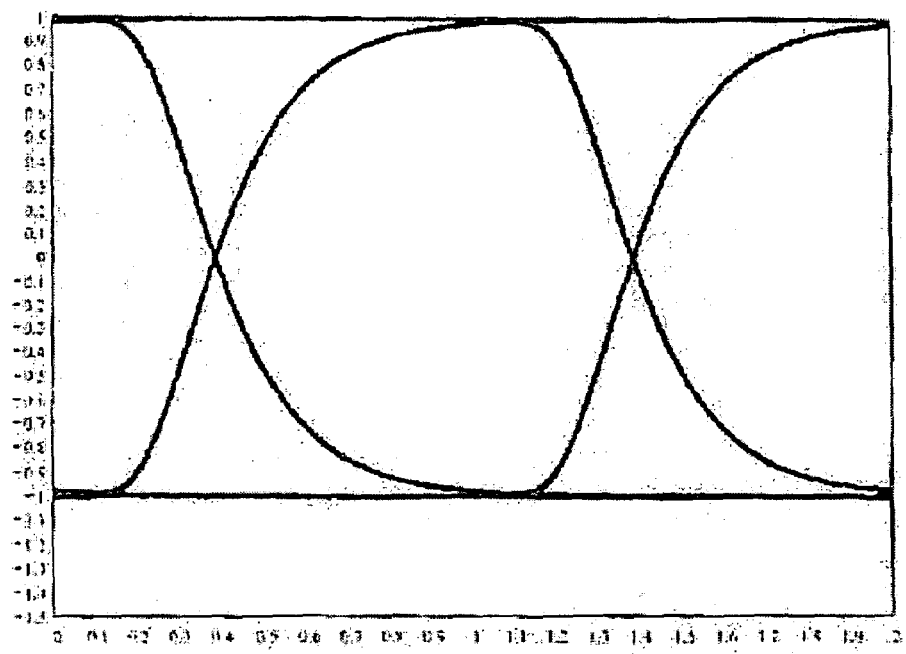
Input Eye Pattern, Rise Time = 175ps
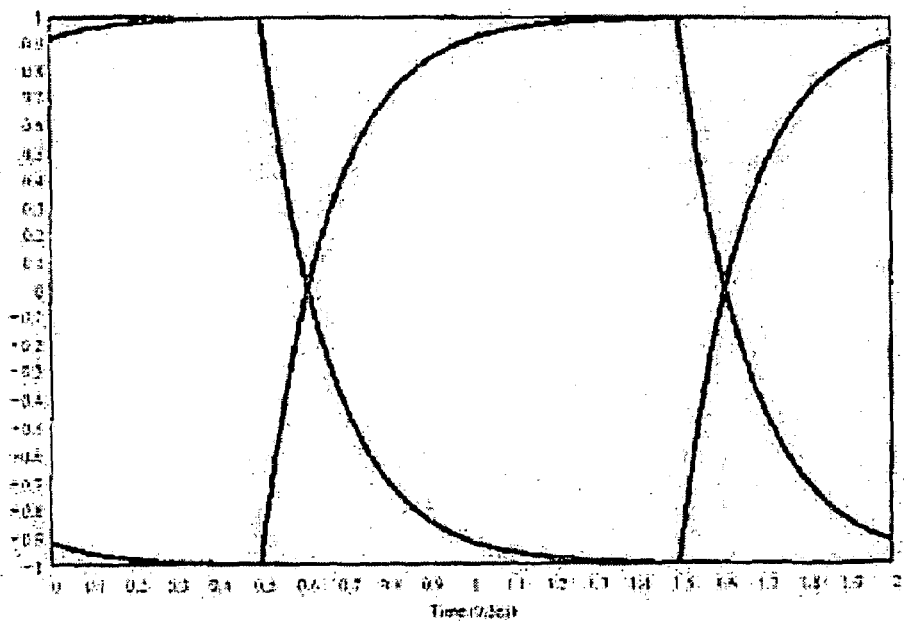
Fig. 16A Output Eye Pattern For 20 LROCS With Cleakage = 0.4pF
(Rise Time = 240ps, 37.1% increase)

Input Eye Pattern, Rise Time = 175ps

Fig. 18B
Output Eye Pattern For 26 L.ROCs With Cleakage = 0.4pF
(Rise Time = 250ps, 43% Increase)
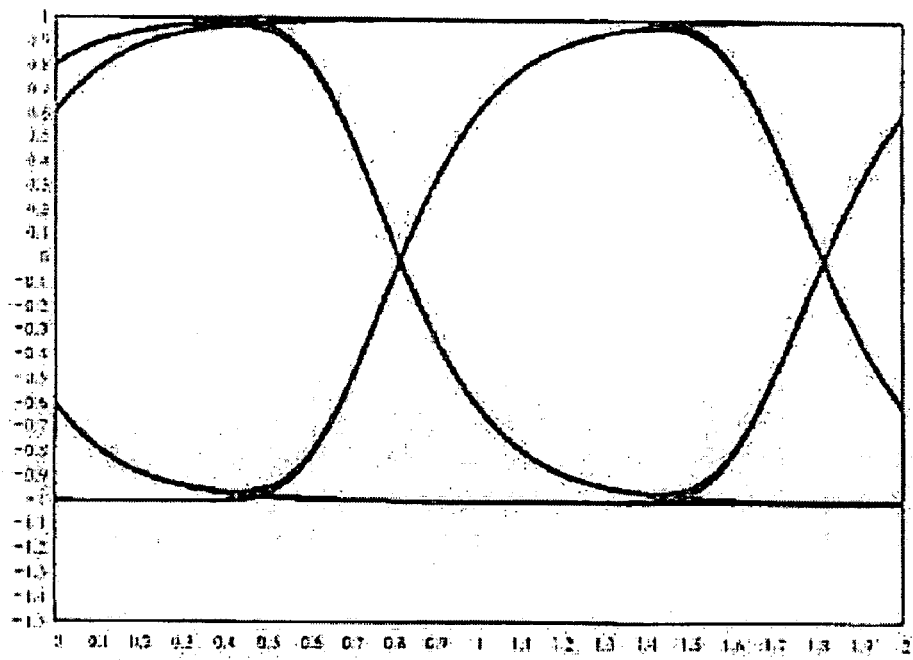
Input Eye Pattern, Rise Time = 175ps
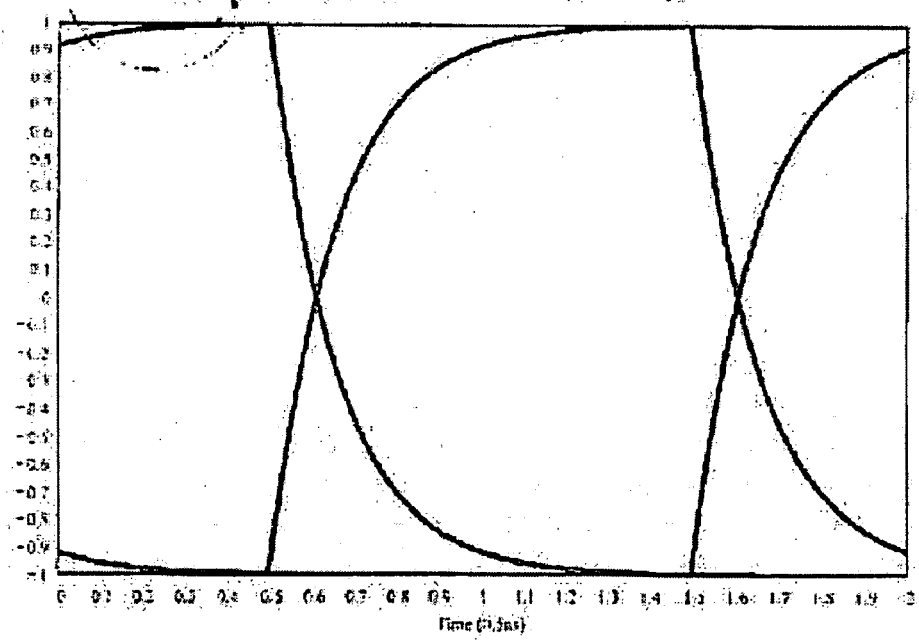
Fig. 18A

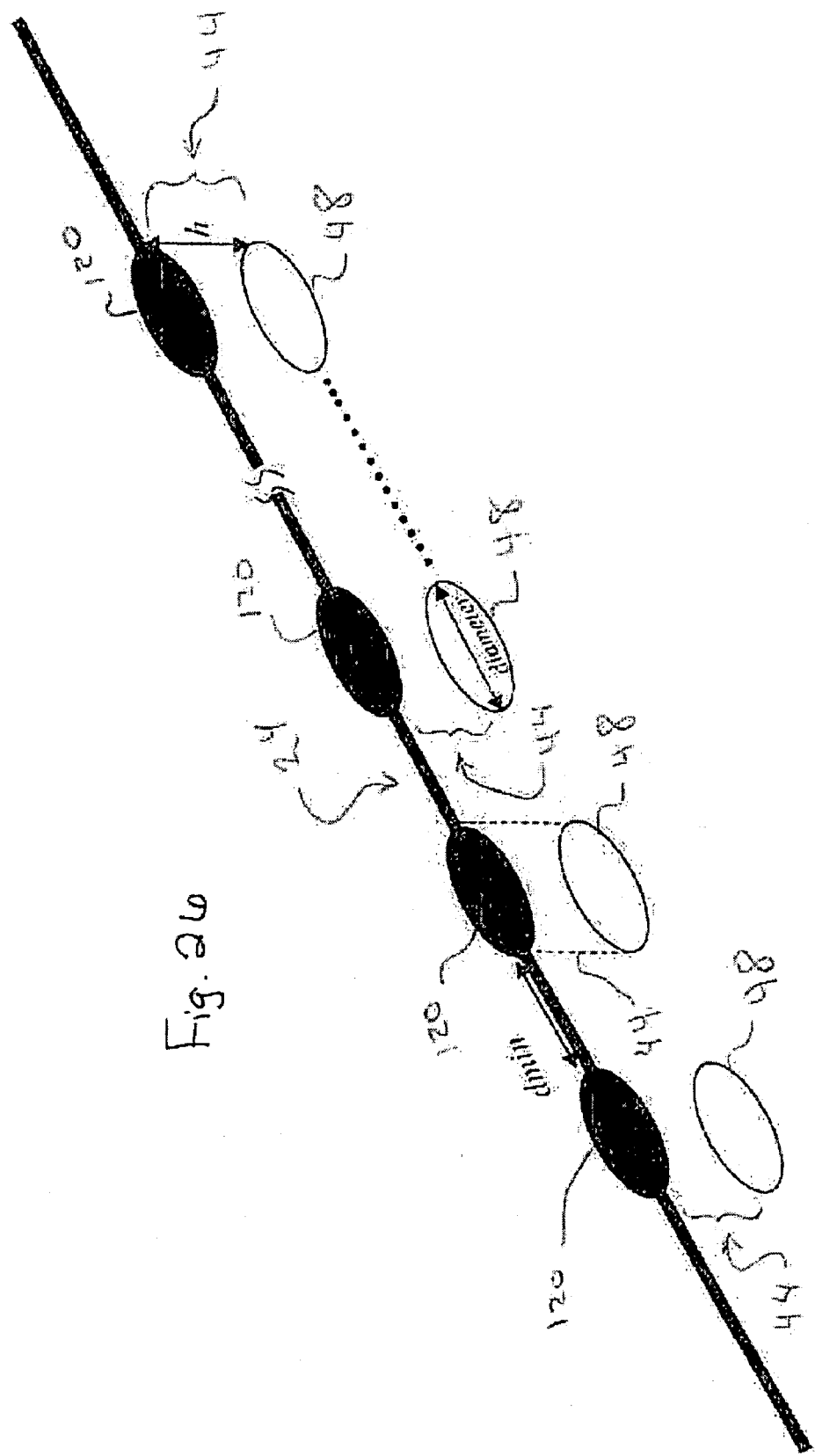

METHOD AND SYSTEM FOR REDUCING RADIATED ENERGY EMISSIONS IN COMPUTATIONAL DEVICES

RELATED FIELD OF THE INVENTION

The present invention is related to a method and apparatus for reducing high frequency electromagnetic radiation from a computational device, and in particular, reducing the emission of such radiation from a conductive trace of a circuit board.

BACKGROUND

There are radiated emission regulatory requirements that must be satisfied by any commercial product. One of these requirements is called the electromagnetic compatibility (or EMC) requirement, which requires that products must not radiate excessive electromagnetic radiation into their intended environment. For electronic products having computational devices therein, electromagnetic radiation may be difficult to restrict from the product's intended environment since there are typically ventilation openings or ducts for air circulation in order to dissipate heat. In particular, such computational devices may generate high frequency electromagnetic radiation, which is characterized by short wavelengths, wherein such radiation is easier to leak through, e.g., ventilation openings.

One source of high frequency electromagnetic radiation generated by computational devices is the voltage oscillations along conductive traces within such devices. In particular, the voltage changes associated with the rise and fall times of the waveforms of bits transmitted along such traces can radiate high frequency electromagnetic radiation. For example, it is known that decreases in the rise and/or fall times increases high frequency energy being radiated. Assuming the rise and fall times are approximately the same, the highest frequency of the radiated energy, in some circumstances, can be roughly characterized as one over twice the rise time. Accordingly, very short rise and/or fall times (e.g., on the order of about 200 picoseconds or less) for digital voltage waveforms can result in unacceptably high frequency energy being radiated from a computational device. However, as computational devices become increasingly faster, bit periods tend to decrease, and accordingly, the corresponding rise and fall times within such bit periods tend to decrease thereby generating increasingly more radiated high frequency electromagnetic energy. Thus, as the computational processing speed increases, additional measures must be taken to make sure that an undesirable amount of high frequency radiation is not released into the environment where it may harm people and/or affect other devices.

One way to reduce the release of such high frequency radiation can be to reduce the number or size of the apertures through which such radiation may exit a housing for a computational device and thereby enter the environment. However, as mentioned above, such a technique could require sophisticated ducting, more powerful ventilation fans, more electromagnetic shielding in the housing, and/or greater attention during manufacturing to properly seal small unintended openings where such radiation could exit.

An alternative approach to reduce the release of such high frequency radiation is to lengthen the rise and fall times of the digital signals by using a signal filtering mechanism. The most straightforward mechanism is a low pass filter that increases the rise and/or fall times. However, conventional techniques for implementing such low pass filters do not perform well when the rise and fall times are very small (e.g., on the order of about 200 picoseconds or less). For example, commercially available discrete resistors, discrete capacitors, discrete conductors operate substantially differently when exposed to such rapid voltage changes of very small rise and/or fall times. In particular, parasitic effects are generated by such components so that a presumed low pass filter circuit having such discrete components will not properly lengthen the rise and/or fall times. For example, a commercial capacitor will generally only behave as a capacitor up to a frequency range of about 25 to 30 megahertz. Beyond this frequency range, such a capacitor will behave as an inductor.

Thus, it would be desirable to be able to effectively attenuate the release of high frequency electromagnetic radiation in a high-speed computational device in a straightforward manner, and without instituting elaborate measures for trapping such high frequency electromagnetic radiation within the confines of a housing for the device.

SUMMARY

The present invention is a method and system for reducing the release of high frequency electromagnetic energy into the environment, wherein local regions of distributed capacitance are embedded within printed circuit boards (PCBs) adjacent the PCB conductive traces. The local regions of capacitance act as low pass filters and thus increase the rise and/or fall times occurring on such adjacent traces. In particular, the present invention increases very short rise and/or fall times (e.g., 200 picoseconds or less) without degrading or detrimentally affecting other signal characteristics. More particularly, the present invention does not substantially affect the voltage amplitude, and does not affect the bit period when lengthening the rise and/or fall time. In addition, the present invention does not induce any timing jitter that may cause synchronization problems within the system.

Embodiments of the local regions of capacitance may be embedded within a PCB circuit board adjacent to a conductive trace (also simply denoted "trace" herein) on which rise and/or fall times are to be increased. Such local regions of capacitance (also denoted as LROCs herein) may be distributed electrically isolated metallic structures, wherein each such structure includes one or more small electrically isolated copper plates or pads (although other conductive materials may be used such as aluminum, silver, or gold). The electrically isolated metallic structures (also denoted as floating metallic structures herein) are not electrically connected to their adjacent traces. However, for a given trace on which the rise and/or fall times are to be increased, the distributed floating metallic structures are positioned adjacent to the trace (also referred to as the "corresponding trace" hereinbelow) so that: (a) their extent along the trace (e.g., overlapping or covering), (b) their distance from the trace, and (c) the distance between the floating capacitive structures are determined such that each such structure operates as a low pass filter on the signals transmitted along the trace.

In one embodiment of the invention, each LROC may be only a single floating metallic plate or pad. In other embodiments, one or more LROCs may each include a plurality of floating metallic plates or pads oriented relative to one another, and to their corresponding trace, for increasing the capacitance of the LROC, and thus increasing the effectiveness of its low pass filtering affects.

Other features and benefits of the present invention will become evident from the accompanying drawing and the Detailed Description hereinbelow.

BRIEF DESCRIPTION OF THE DRAWINGS

FIG. 1 shows a prior art representation of a single PCB circuit board conductive trace sandwiched between two reference planes 36 and 40. The crosshatched areas 28 and 32 represent return current, which travels in the opposite direction from that of the current traveling through the trace 24.

FIG. 2 shows a cross section of an embodiment of a PCB circuit board of the present invention wherein a floating metallic structure 48 is provided adjacent to the trace 24.

FIG. 8 shows the eye pattern for a trace 24 that has the local regions of capacitance 44 adjacent to (and/or surrounding) the trace. In addition, each of these LROCs were simulated with a net capacitance equal to 0.5 picofarads (pF).

FIGS. 11A and 11B show, respectively, the input and output eye patterns, wherein the input rise time is 175 picoseconds (ps) and the number of LROCs is equal to ten, with each LROC producing 0.184 picofarads of capacitance. Note, the output rise time of 187.5 ps has increased by 7.1% over the input rise time of 175 ps.

FIGS. 12A and 12B show, respectively, the input and output eye patterns, wherein the input rise time is 175 ps and the number of LROCs is equal to twenty, with each LROC producing 0.184 picofarads of capacitance. Note, the output rise time of 190 ps has increased by 8.8% over the input rise time of 175 ps.

FIGS. 14A and 14B shows the input and output eye patterns, wherein the input rise time is 175 ps and the number of LROCs is equal to twenty, with each LROC producing 0.283 picofarads of capacitance. Note, the output rise time of 212.5 ps has increased by 21.4% over the input rise time of 175 ps.

FIGS. 15A and 15B show, respectively, the input and output eye patterns, wherein the input rise time is 175 ps and the number of LROCs is equal to twenty-six with each LROC producing 0.283 picofarads of capacitance. Note, the output rise time of 215 ps has increased by 23% over the input rise time of 175 ps.

FIGS. 16A and 16B show, respectively, the input and output eye patterns, wherein the input rise time is 175 ps and the number of LROCs is equal to ten, with each LROC producing 0.4 picofarads of capacitance. Note, the output rise time of 210 ps has increased by 20% over the input rise time of 175 ps.

FIGS. 18A and 18B show, respectively, the input and output eye patterns, wherein the input rise time is 175 ps and the number of LROCs is equal to twenty-six, with each LROC producing 0.4 picofarads of capacitance. Note, the output rise time of 250 ps has increased by 43% over the input rise time of 175 ps.

FIG. 26 shows an alternative embodiment of the invention that may minimize the number of floating structures needed to achieve a given LROC capacitance.

DETAILED DESCRIPTION

Without being bound by a particular theoretical basis, the laws of physics state that all currents within a circuit must return to their source(s). For printed circuit boards (PCBs) such current return paths are known to be generally immediately above and/or immediately below the trace on which the current is transmitted. Additionally, such return paths are generally near the surfaces of the PCB circuit boards, such surfaces commonly referred to as "reference planes". The present invention induces high frequency currents, being transmitted along a PCB trace, to be re-routed by a local region of capacitance (LROC) adjacent to the trace and returned to the current source via the current return paths near the reference planes. As a result, there is a reduction in high frequency radiation emitted from the PCB circuit board. Said differently, since an LROC presents a low-impedance path back to the current source for high-frequency currents, it is believed that such an LROC captures high frequency noise currents occurring on the trace, and returns them to their source.

FIG. 1 illustrates the above described theoretical basis for the invention, wherein a PCB circuit board 20 cross section has a trace 24 embedded therein (the trace extending perpendicularly to the plane of FIG. 1), and the return currents 28 and 32 are represented by the cross-hatched areas adjacent the PCB surfaces or reference planes 36 and 40.

Figure 3:
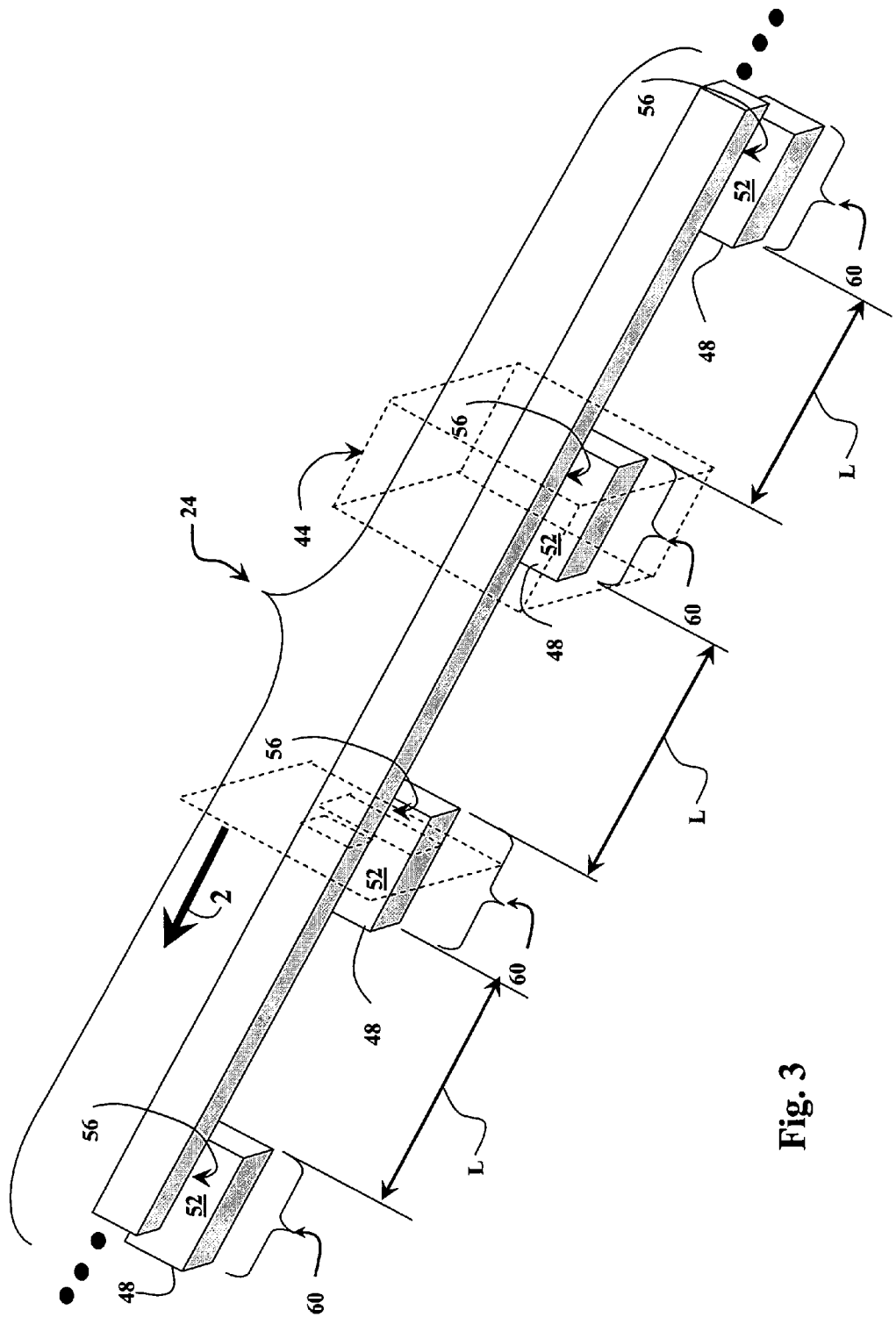
FIG. 3 shows an internal perspective view of a PCB circuit board with a signal trace 24 having a plurality of the floating metallic structures 48 distributed adjacently along the length of the trace.

FIGS. 2 and 3 show one embodiment of the present invention, wherein LROCs 44 are distributed underneath the trace 24. In particular, each LROC 44 is simply a single floating metallic structure (e.g., a pad) 48 underneath another metallic structure (i.e., the trace), wherein each of the structures 48 and the trace 24 includes a respective surface 52 and 56, these surfaces being parallel to one another over a predetermined (short) distance 60 (i.e., the length of the floating structure 48). Thus, for each of the metallic structures 48, when a current flows along the trace 24, a capacitance ($C_1$) may be induced between the metallic structure 48 and the trace 24 over the local region (of distance 60) in which the structures are adjacent. In particular, as described hereinabove, the present invention contemplates the lower metallic structure 48 being "floating", meaning that it is not conductively attached to another conductive structure. Additionally, for each of the metallic structures 48, a capacitance ($C_2$) between the floating structure 48 (e.g., a piece of copper) and its nearest reference plane (i.e., reference plane 36, FIG. 2) may be induced. Accordingly, when a current on the trace 24 passes by the floating conductive structure 48, then depending upon: (a) the capacitance $C_1$ associated with the corresponding induced capacitor 64 (FIG. 2), (b) the capacitance $C_2$ associated with the corresponding induced capacitor 68, and additionally depending upon (c) the frequencies associated with this current floating through the trace, the local total capacitance of the series combination of $C_1$ and $C_2$ can be configured to behave as a capacitor without parasitic effects. In other words, the impedance of the combination of the capacitors 64 and 68 should be substantially $1/(2 \cdot \pi \cdot f \cdot C)$, where f is the frequency and C is the total capacitance of the capacitors $C_1$ and $C_2$. Thus as the frequency f of the trace current gets very high (e.g., above 2 gigahertz), the impedance gets very small and so this current tends to take the path of smaller impedance back to its source. Accordingly, the present invention is directed to attenuating the noise currents corresponding to such very high frequencies, wherein such noise currents tend to take an alternative path through the floating structure(s) 48 back to the source and thus high frequency radiated emissions are attenuated.

Figure 4:
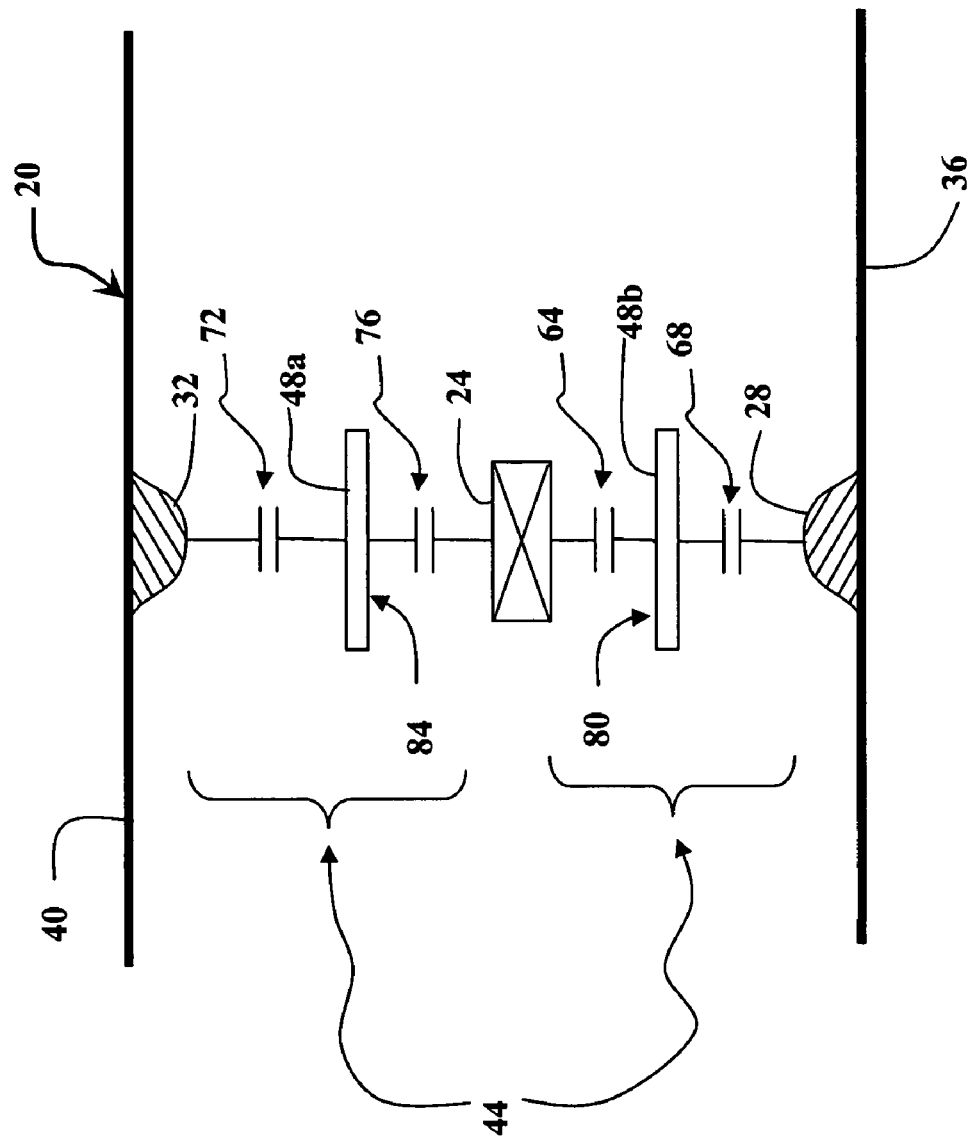
FIG. 4 shows another cross section of a PCB circuit board according to the present invention, wherein there are two floating metallic structures 48a and 48b provided adjacent to the trace 24.
Figure 5:
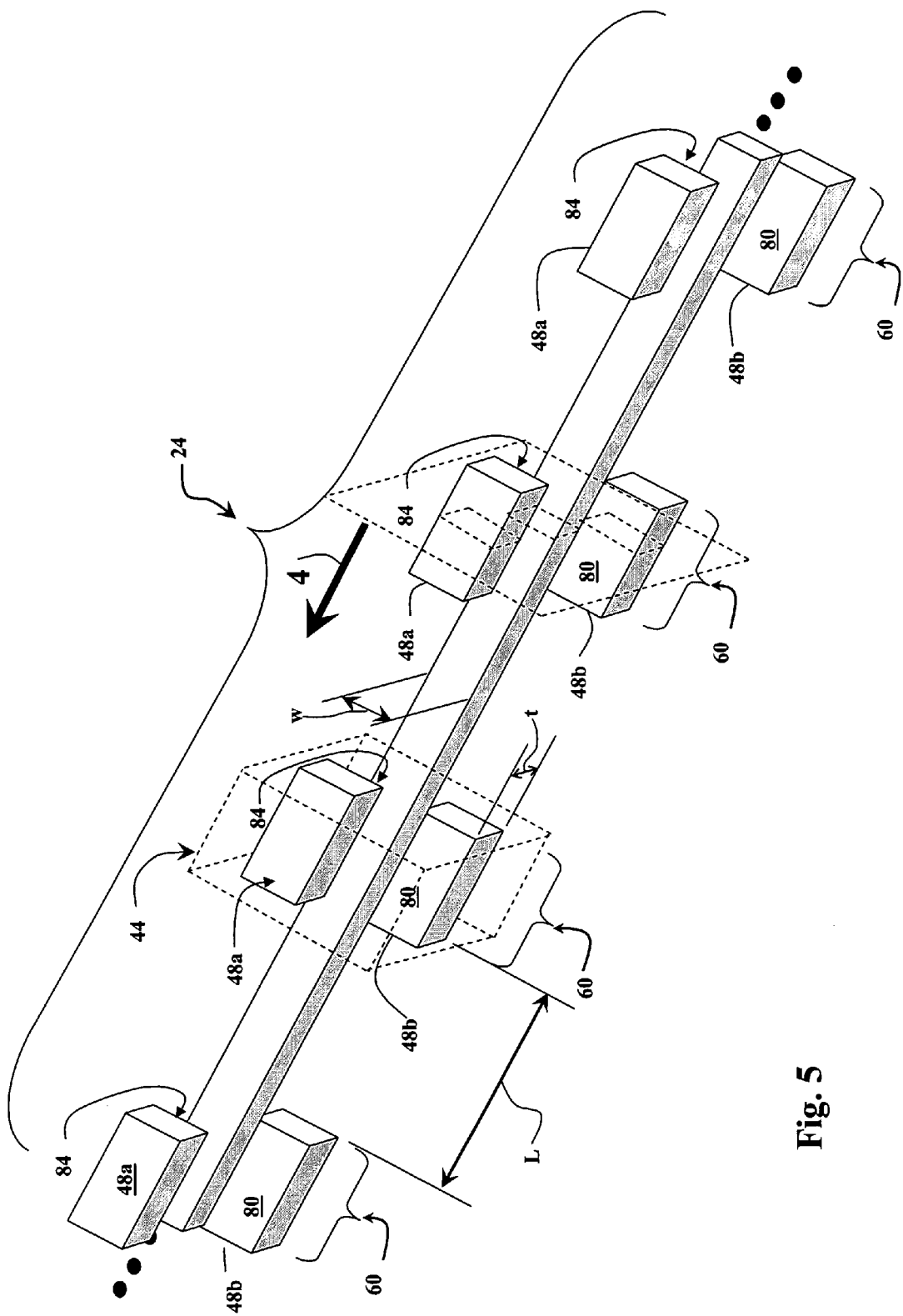
FIG. 5 shows an internal perspective view of a PCB circuit board with a signal trace 24 having a plurality of the floating metallic structures 48 distributed adjacently along the length of the trace both above and below the trace.

An alternative embodiment of the invention is illustrated in FIGS. 4 and 5, wherein each LROC 44 includes two of the floating metallic structures 48 (identified for clarity here as 48a and 48b), one such structure above the trace 24 and another below the trace 24. In this embodiment, the additional floating metallic structures 48a (e.g., floating pieces of copper) can be used to further improve high frequency noise signal attenuation. In particular, there is a structure 48a, which is a mirror image of the lower metallic structure 48b, provided above the trace 24 as shown in FIGS. 4 and 5 so that the trace is substantially midway between both reference planes 36 and 40 and midway between the floating structures 48a and 48b (FIG. 4) that are above and below the trace. Of course, structures 24, 48a, and 48b could be placed asymmetrically between the reference planes 36 and 40, as one skilled in art will understand.

Assuming the corresponding capacitances for the capacitors 72 and 76 of upper floating metallic structure 48a are identical with capacitances $C_1$ and $C_2$ described above for the capacitances of the lower structure 48b, the total capacitance of the LROC 44 of FIG. 4 (i.e., in a local region adjacent the trace 24) is the series capacitance $C_1$ and $C_2$ in parallel with the series capacitance $C_1$ and $C_2$, i.e., $C_T = 2((C_1 * C_2)/(C_1 + C_2))$. Of course, capacitors 72, 76, 64, and 68 can have different values as one skilled in the art will understand.

There are certain geometric attributes of such floating metallic structures 48 that the present invention contemplates providing values (or ranges of values) for enhancing the filtering of very high frequencies. For example, the length 60 of such floating metallic structures 48 along the length of the trace 24 is one such attribute (discussed at (b) below). In particular, such floating metallic structures 48 should satisfy certain geometric conditions that allow each local (LROC) capacitance to be modeled as substantially a discrete capacitor. For instance, the conditions described in (a) through (e) immediately below are satisfied in a preferred embodiment of the invention:

(a) In order for such a floating metallic structure 48 to be effective for providing at least a portion of a local region of capacitance 44, the floating structure must be close to its corresponding trace 24. For example, the distance between reference planes 36 and 40 is typically about 10-20 thousandths of an inch (mils) for very high-speed devices. The distance between a floating metallic structure 48 (or 48a, 48b), and its corresponding trace 24 should be about half the distance between the trace 24 and the reference plane nearest the floating metallic structure. This distance will typically be between about 1.4 mils and 6.2 mils, for any PCB dielectric material.

(b) In order for such a floating metallic structure 48 to operate substantially as a pure capacitor (i.e., with substantially no parasitic effects), the floating metallic structure must be relatively short in the direction of the length of its corresponding trace 24 (i.e., in the direction of arrow 2 of FIG. 3, and/or arrow 4 of FIG. 5) since otherwise, the floating metallic structure has an undesirable inductive component as well. Said another way, the greater the extent of such a floating metallic structure 48 along the length of its corresponding trace, the more inductive it becomes, and accordingly, the floating structure acts less like a capacitor, as one skilled in the art will understand. In particular, it is preferred that the extent 60 (FIGS. 3 and 5) of such a floating metallic structure 48 along its corresponding trace 24: (i) be between 10 mils and 50 mils long, and/or (ii) less than approximately 0.25 of the required distance along the trace 24 for propagating the rise time (or fall time). For example, letting $L_{Tr}$ denote the required distance along the trace 24 for propagating the rise time (or fall time), if the trace 24 provides a signal propagation delay of 160 picoseconds/inch and the rise time Tr is approximately 10 picoseconds (as it is likely to be in the near future), then $L_{Tr}$ is approximately $\frac{1}{16}$ inches (=62.5 mils), and if a floating metallic structure 48 is to be 0.20 of $L_{Tr}$, then the extent of floating metallic structure along the trace is $\frac{1}{80}$ inches (=12.5 mils). It is further believed that the range in the extent 60 of such a floating metallic structure along its corresponding trace 24 should be approximately between 10 mils and 50 mils in order to provide an effective local (LROC) capacitance for most devices having signal rise times less than about 200 picoseconds. Moreover, in at least one embodiment, it is believed that the extent of such a floating metallic structure should be less than or equal to 5.1 percent of the length $L_{Tr}$.

(c) Typically, it is preferred that a floating metallic structure 48 extend beyond the width of the adjacent face the corresponding trace 24. That is, referring to FIGS. 4 and 5, the faces 80 and 84 of the respective floating metallic structures 48a and 48b should extend beyond the width "w" (FIG. 5) of the trace 24. The reason for this is that any fringing fields that may exist on the edges of the trace 24 can be also used to increase the capacitance related to the floating metallic structure 48. In particular, it is believed that in at least one embodiment, such a floating metallic structure 48 should extend beyond the width w of the corresponding trace by about 2 w or 200% of w; e.g., the width of the floating metallic structure would be about 300% of w, with an extent approximately equal to w extending on either side of the trace beyond the trace's width. Moreover, in at least one embodiment, such a floating metallic structure 48 should be approximately 2 to 5 mils from the corresponding trace.

(d) It is believed that the floating metallic structures 48 can be variously shaped, and in fact, it is believed that the shape and thickness "t" (FIG. 5) of such a floating structure (i.e., "t" extending in a direction proceeding substantially orthogonally away from the signal conducting direction along the corresponding trace) can vary significantly. However, it is also believed that the more of the surface area of a trace that is covered or overlapped by the surface(s) of such a floating metallic structure 48, the more capacitance will be generated. Thus, floating metallic structures 48 having square and/or rectangular surfaces facing and extending along their corresponding trace 24 (e.g., FIGS. 3 and 5) may provide more capacitance than, e.g., a diamond, circular, or an oval shaped floating metallic structure when, e.g., the trace is has substantially straight sides.

(e) As specified earlier, there may be LROCs 44 distributed adjacently along the length of a trace 24. However, the distance L (FIGS. 3 and 5) between two consecutive LROCs 44 is important for obtaining the desired low pass filtering effects of the present invention. In particular, the distance L between the consecutive local regions of capacitance 44 must be such that the total signal delay time along the corresponding trace 24 between the two LROCs is much larger than, e.g., the rise time (and/or fall time).

When the total signal delay time along a trace 24 between two LROCs 44 is much larger than, e.g., the rise time (and/or fall time), then the interconnecting portion of the trace 24 corresponding to the length L may be considered a transmission line between these two LROCs. This implies that when an entire signal pulse is transmitted on the interconnecting portion (e.g., L in FIG. 5), the corresponding voltage will be different at different points along the interconnecting portion; i.e., the voltage is distributed along the interconnecting portion L thereby making it a distributed circuit or transmission line, as one skilled in the art will understand. Thus, assuming the rise and fall times are approximately the same (which in general is the case), it is preferred that the total time delay ($Td_{TOTAL}$) for signal transmission across an interconnection portion should be at least 100% of the rise time.

Additionally, assuming that the signal propagation delay along the interconnection portion is TL (e.g., in units of picoseconds/inch), then $Tr/T_L$ provides a minimal bound on the distance L between such local regions of capacitance 44, wherein the interconnection portion is just long enough to fully contain the signal for at least, e.g., the rise time. However, in some embodiments, L may be reduced to be greater than or equal to 52% of L. The following example is illustrative for determining a value for L. For most commercially available PCB circuit boards, the substrate for these boards is composed of the dielectric commonly identified as FR-4 as one skilled in the art will understand, wherein a plurality of traces 24 are provided therein.

Figure 10:
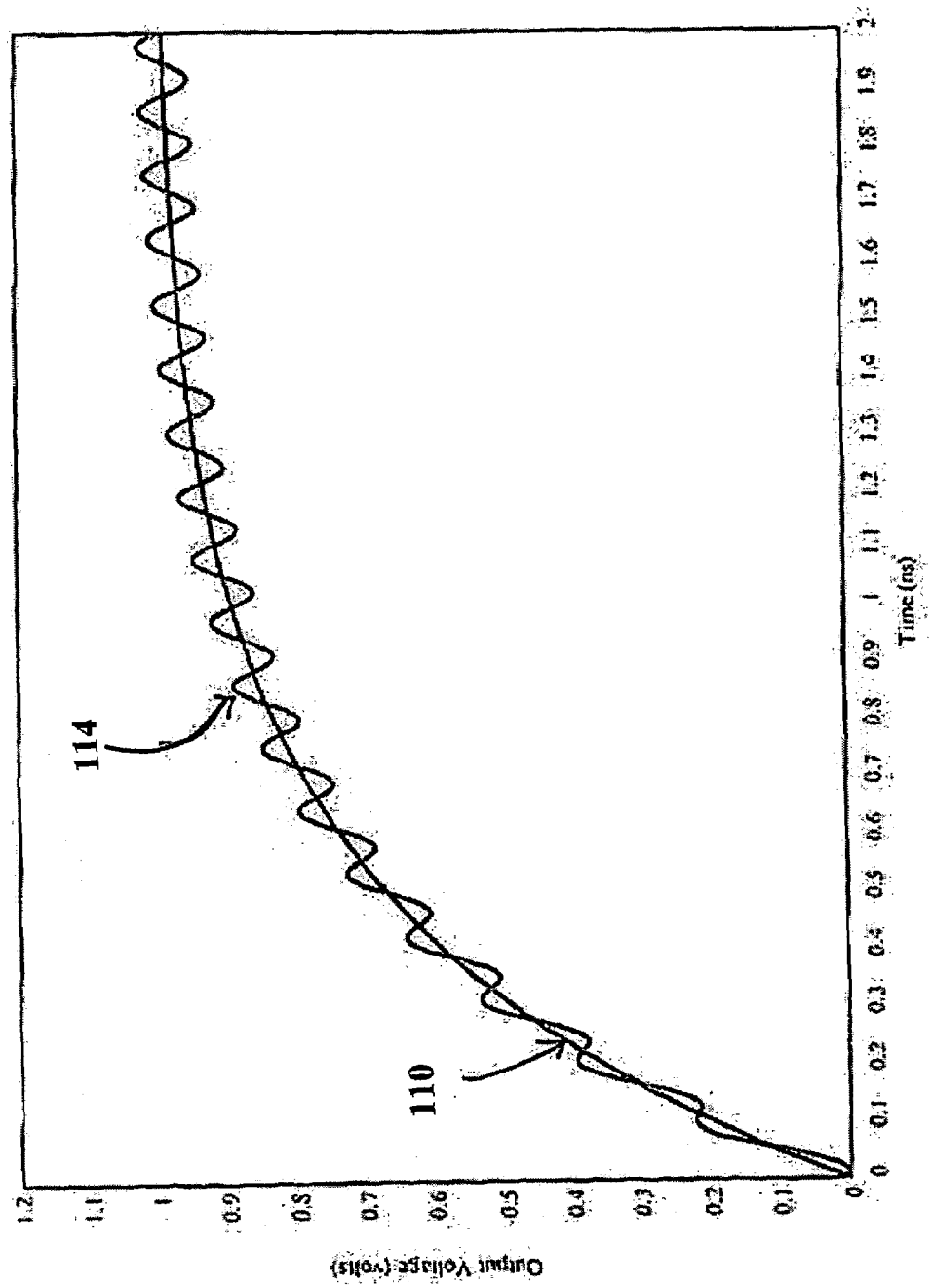
FIG. 10 is a graph showing the voltages in the situation in which two identical LROCs are placed too close together along a trace 24. Specifically, the two graphs 110 and 114 shown in this figure are, respectively, for an input signal to the first LROC, and the corresponding signal appearing at the output of the first LROC of the two LROCs.
Figure 13B:
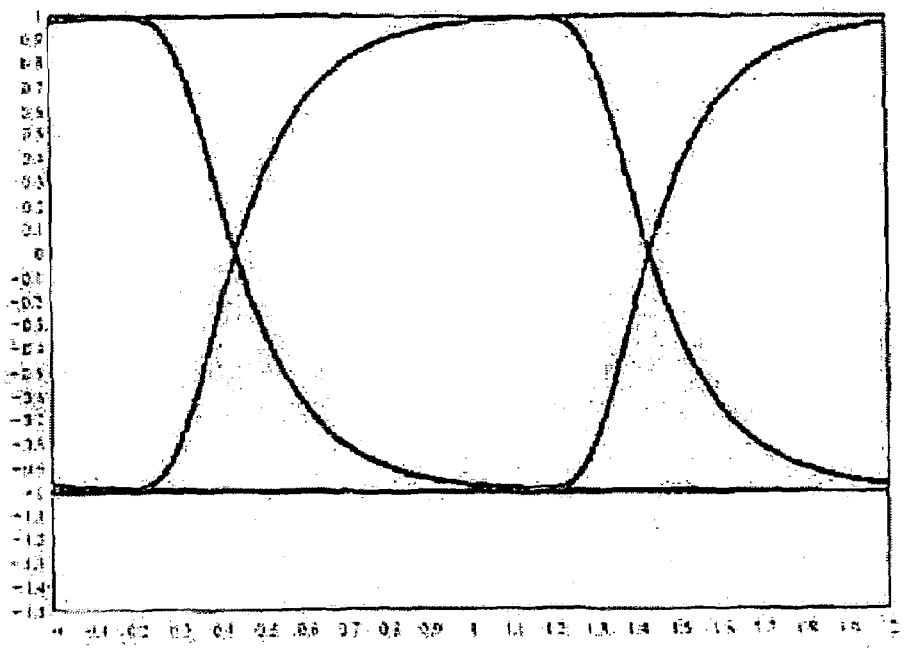
FIGS. 13A and 13B show, respectively, the input and output eye patterns, wherein the input rise time is 175 ps and the number of LROCs is equal to twenty-six, with each LROC producing 0.184 picofarads of capacitance. Note, the output rise time of 195 has increased by 11.4% over the input rise time of 175 ps.
Figure 13A:
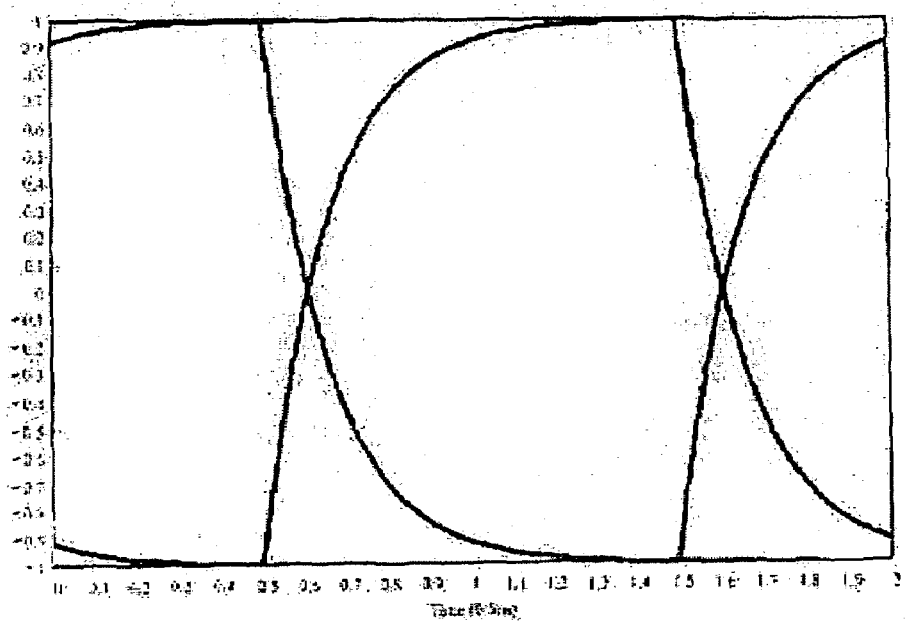
Figure 17B:
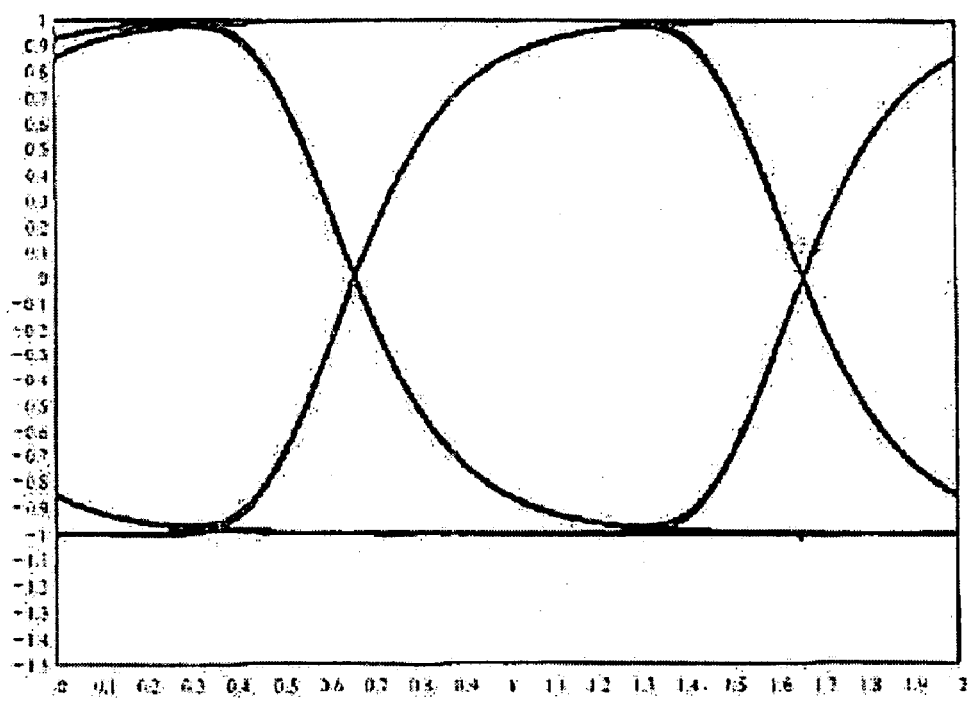
FIGS. 17A and 17B show, respectively, the input and output eye patterns, wherein the input rise time is 175 ps and the number of LROCs is equal to twenty, with each LROC producing 0.4 picofarads of capacitance. Note, the output rise time of 240 ps has increased by 37.1% over the input rise time of 175 ps.
Figure 17A:
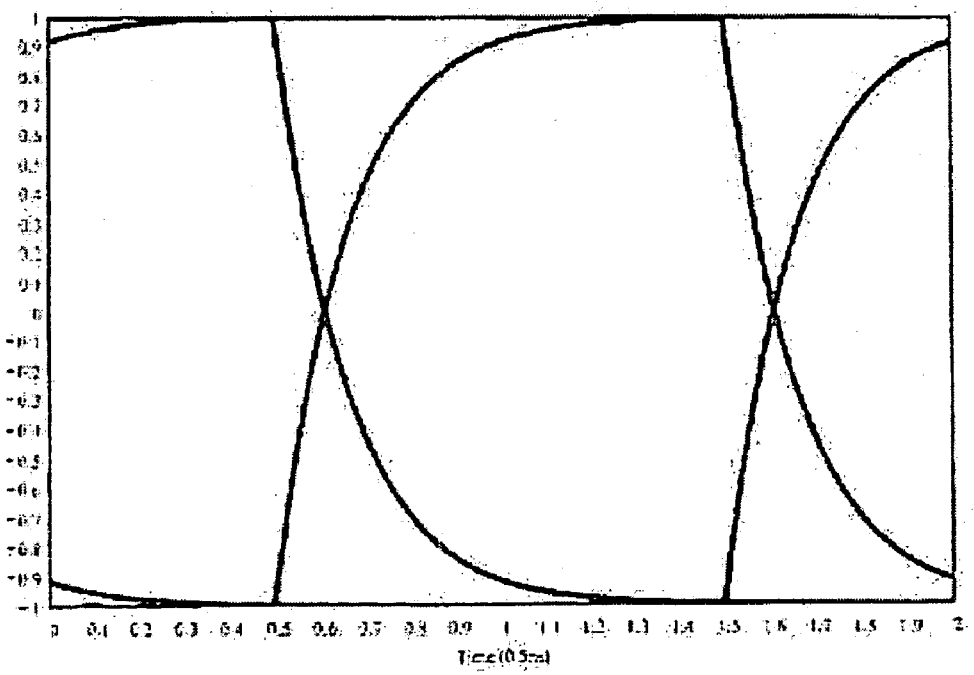

However, other substrate materials are within the scope of the present invention, such as a dielectric material that is characterized with a real relative dielectric permittivity greater than or equal to about 4.0 at a signal frequency $1/(2t_r)$ Hertz, wherein $t_r$ is the signal rise time. Note that there are generally two types of traces provided in such PCB circuit boards: microstrips and striplines. The signal propagation delay for a microstrip is approximately 160 picoseconds/inch, and the signal propagation delay for a stripline is approximately 180 picoseconds/inch. Assuming a rise time Tr in extremely high speed circuits in the range of, e.g., 40 picoseconds on a one inch microstrip trace 24, and assuming that each LROC 44 has relatively negligible extent 60 (e.g., 10 mils), then the one inch of microstrip trace, would be able to contain approximately 4 (=160/40) rise times, or equivalently, the length between LROCs 44 should be at least ¼ of an inch. A simulated example illustrating the undesirability of the length L being too short is shown in FIG. 10 and described hereinbelow.

Accordingly, by combining the geometric characteristics of a floating metallic structure 48 as recited in (a) through (e) above, various geometric embodiments of the floating metallic structures can be obtained, such as an embodiment wherein each LROC 44 along a trace 24 is spaced apart from other LROCs along the trace by at least ⅛ of an inch, and each floating metallic structure of the LROCs has a substantially rectangular extent facing the trace 24 (as shown in FIGS. 3 and 5), wherein each floating metallic structure: (i) is about 2 mils from the trace, (ii) extends about 50 mils along the trace, and (iii) extends about 10 mils beyond the width w of the trace on either side. However, as stated above, various other embodiments are also possible such as oval or elliptical embodiments of the floating metallic structures 48 as is shown in FIG. 26.

Figure 19:
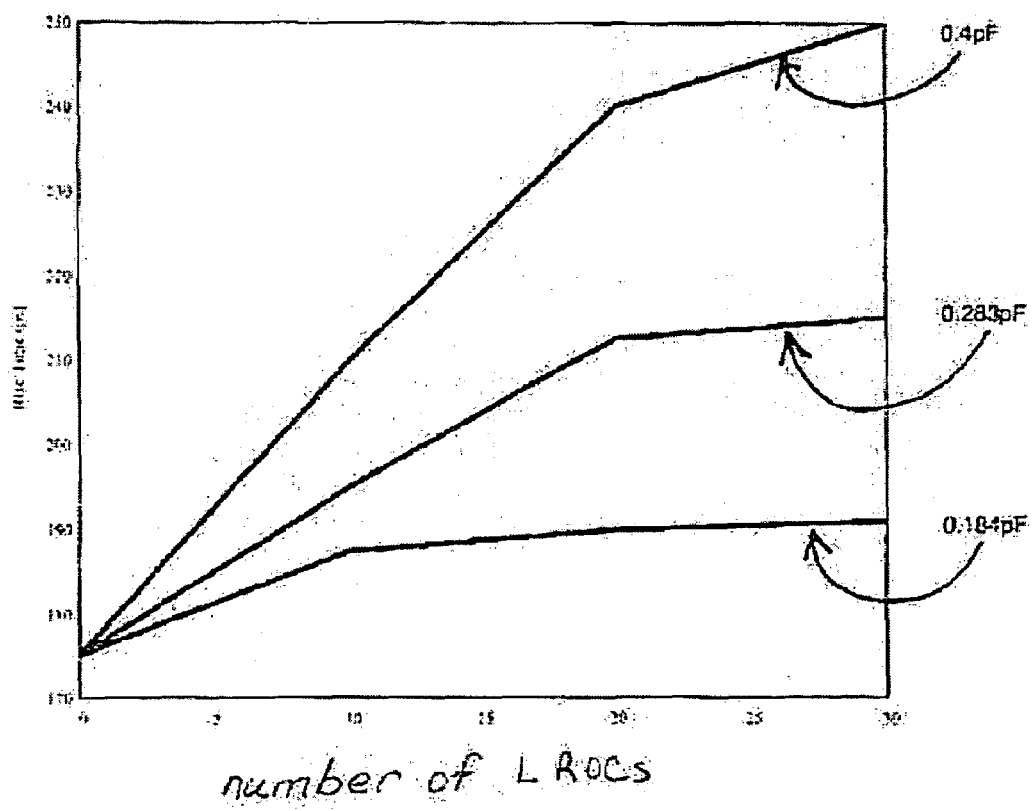
FIG. 19 shows the achievable increases in the input 175 picosecond rise time as a function of the number of identical LROCs with LROC capacitances of 0.4 picofarads, 0.283 picofarads, and 0.184 picofarads.
Figure 20:
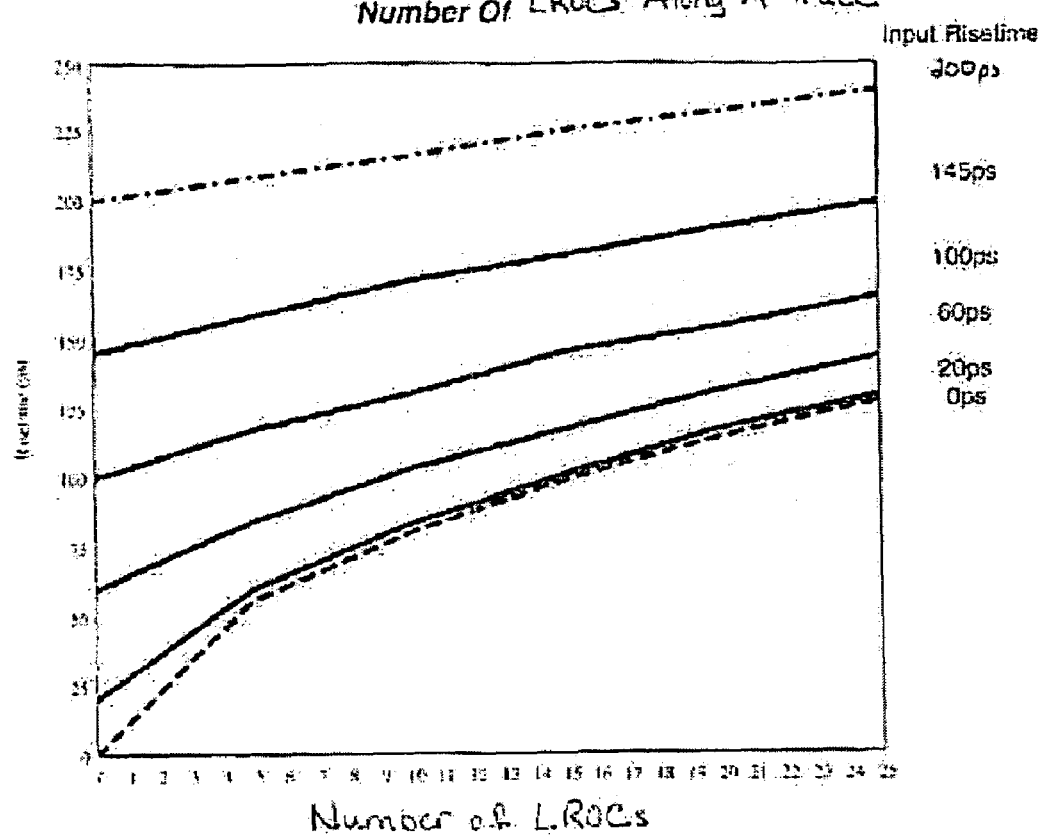
FIG. 20 shows simulated achievable increases of the input rise times as a function of the number of identical LROCs, with the capacitance of each LROC equal to 0.4 picofarads. The input rise times are 0 picoseconds, 20 picoseconds, 60 picoseconds, 100 picoseconds, 145 picoseconds, and 200 picoseconds.

Note that the number of distributed LROCs 44 depends on the amount of capacitance needed to lengthen very short rise and/or fall times generated by the computational device so that the radiated electromagnetic emissions are reduced. For example, FIGS. 19-20 illustrate the needed LROC capacitances as well as the number of LROCs to achieve a given increase in the rise/fall times of the input signal. In fact, in some embodiments, only one such LROC 44 adjacent to a trace 24 may be needed.

Figure 6:
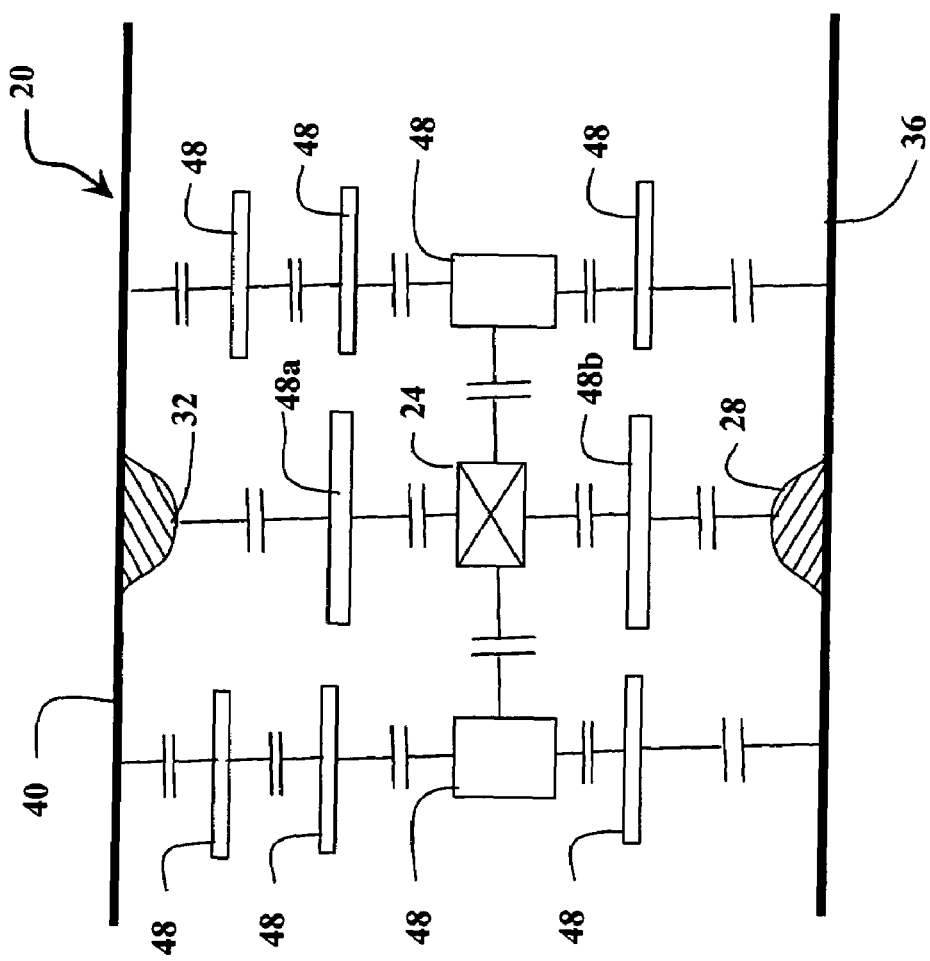
FIG. 6 shows another cross section embodiment of a PCB circuit board according to the present invention, wherein there are floating metallic structures 48 adjacent to and surrounding the trace 24.

In yet other embodiments of the invention, additional floating metallic structures 48 may be provided adjacent to a trace 24 as shown in FIG. 6.

Figure 7:
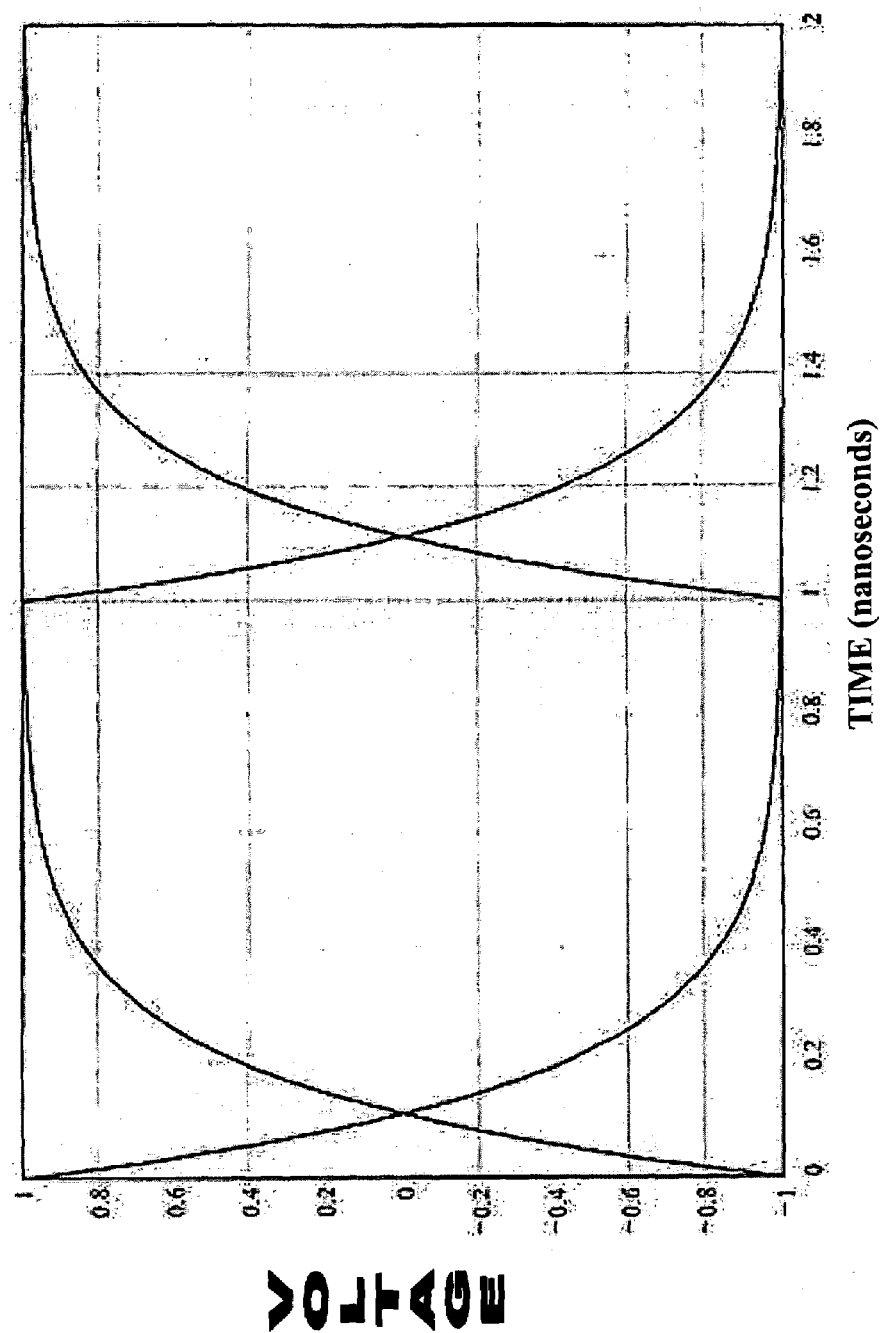
FIG. 7 shows a graph of an eye pattern for a 2 Gigabit/sec input data stream that is transmitted through a conductive trace 24 having no adjacent LROCs 44, alongside the trace or surrounding the trace 24. In this case, the input rise time is about 175 picoseconds.
Figure 8:
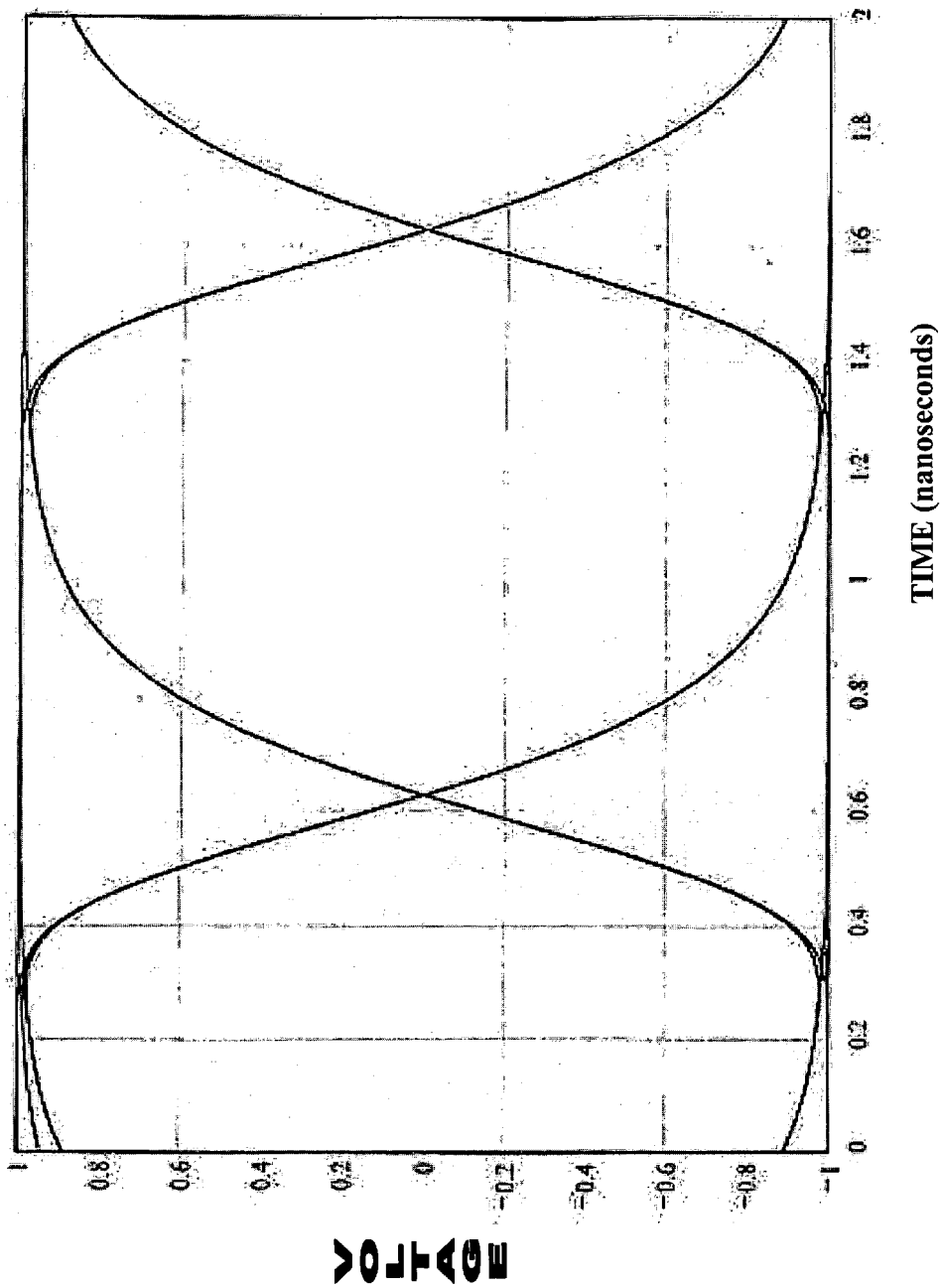
FIG. 8 shows a graph of an eye pattern for a simulation wherein the input bit stream used in FIG. 7 is propagated through a trace 24 with twenty LROCs 44 distributed alongside and surrounding the trace 24. That is.

Viewing eye patterns of a device (i.e., a PCB circuit board) are well known in the art as a visual technique for assessing the stability of a computational device, and accordingly may be used to demonstrate various benefits of the present invention. In particular, eye patterns, as one skilled in the art will understand, are simply the superposition of all possible transitions of 1 s and 0 s in a data stream; i.e., a 0 to 1, a 1 to 0, a 1 to 1, a 0 to 0, a 00 to 0, a 00 to 1, and so on superimposed on top of each other. Thus, eye patterns determine the response of a digital system to these kinds of pattern transitions, and provide visual information indicative of the timing jitter occurring in the computational device as well as the duration and amplitude of the rise and fall times. FIGS. 7 and 8 show graphs of eye patterns of an input 2 Gb/sec signal with a 175 picosecond rise time, and the output signal after propagation through twenty 0.5 picofarad LROCs, respectively. In particular, FIG. 7 shows the eye patterns for a trace 24 that does not have the local regions of capacitance 44 of the present invention adjacent thereto (and/or surrounding). Thus, FIG. 7 shows a rise time of approximately 175 picoseconds. On the other hand, FIG. 8 shows the eye patterns for a trace 24 having the local regions of capacitance 44 according to the present invention adjacent thereto (or surrounding a portion of the trace). More precisely, the trace 24 for FIG. 8 has twenty such local regions of capacitance 44 adjacent thereto according to the present invention, wherein these regions of capacitance are 0.054 inches in length along the trace, and are spaced apart by 0.505 inches, wherein each such local region of capacitance 44 generates a leakage capacitance of 0.5 picofarads from the trace. Accordingly, FIG. 8 shows a rise time of approximately 232 picoseconds, which is a 32.6% increase in rise time without substantially affecting the bit period, noise margin, or timing jitter. Moreover, note that the amplitude of the signals shown in FIG. 8 are only trivially reduced from those of FIG. 7 (more precisely, FIG. 7 shows a total signal amplitude of two volts as the noise margin, whereas FIG. 8 shows a noise margin of approximately 1.95). Additionally, since the crossings of the rising and falling portions of the graphs in FIG. 8 are substantially at zero voltage, this illustrates that the present invention is not likely to add any appreciable timing jitter to the computational device.

Figure 9:
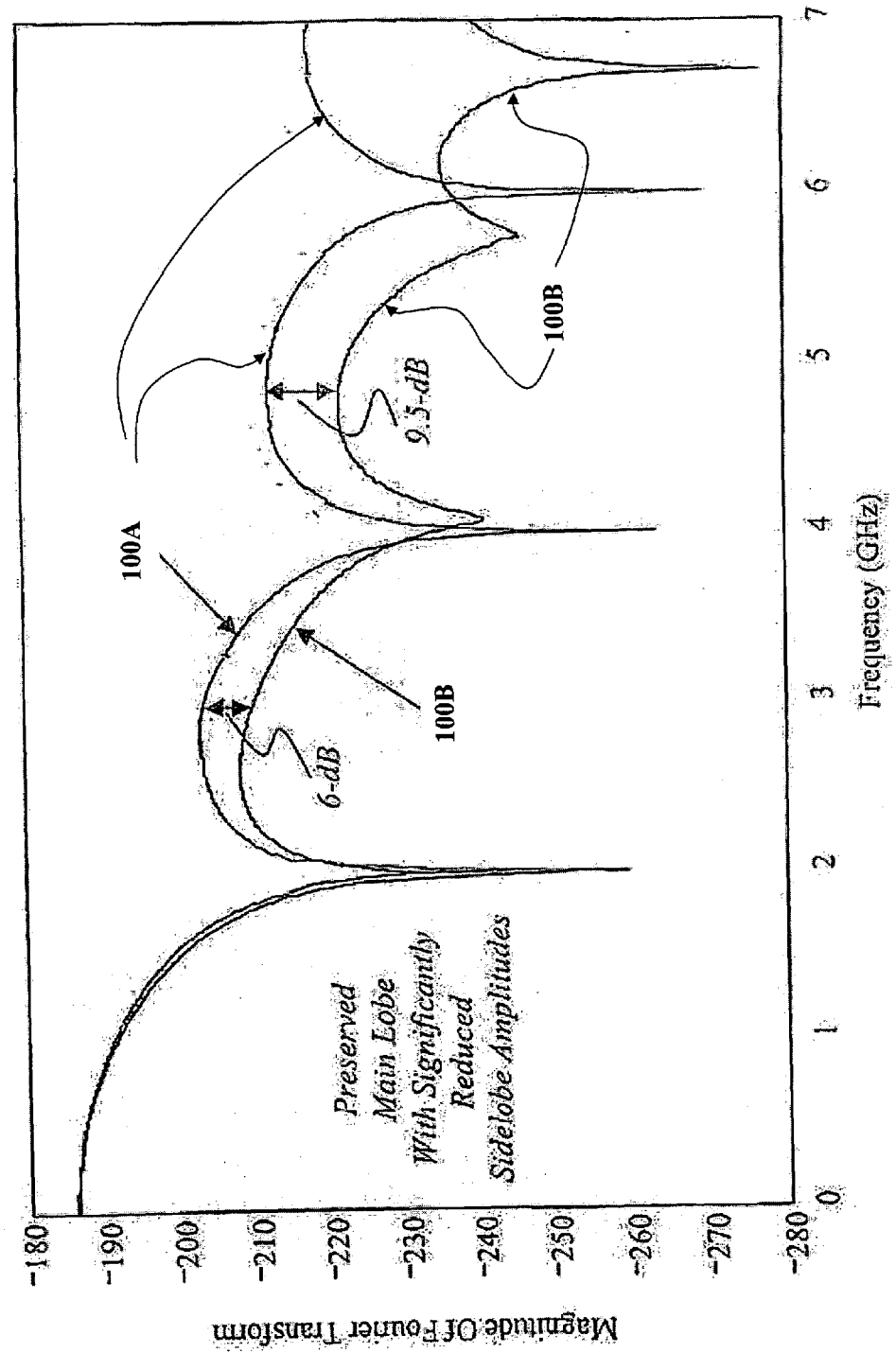
FIG. 9 shows superimposed graphs of simulations of the corresponding energy emissions from the traces 24 providing the eye patterns of FIGS. 7 and 8.

FIG. 9 shows superimposed graphs of simulations of the corresponding energy emissions from the traces providing the eye patterns of FIGS. 7 and 8. In particular, graph 100A is for the trace corresponding to FIG. 7, and graph 100B is for the trace 24 corresponding to FIG. 8, which utilizes the present invention. As can be seen, the invention acts as low pass filter, wherein as the frequency increases, the energy radiated (in the present case, simulated by the magnitude of the Fourier transform, as one skilled in the art will understand) is progressively attenuated.

FIG. 10 shows the results of a simulation when the distance between two adjacent LROCs is too small. In particular, FIG. 10 simulates two consecutive LROCs 44 provided along a trace 24, wherein the distance between the LROCs is 78 mils, and wherein a signal having a rise time of 1.0 nanoseconds is transmitted on the trace. Additionally, each of the two LROCs 44 has the following characteristics: a trace leakage capacitance of 0.35 picofarads, resistance of 0.078 Ohms, inductance of 0.9 nano-Henries. Graph 110 of FIG. 10 shows the input voltage to the portion of the trace having the two LROCS 44 during the rise time. Graph 114 of FIG. 10 shows a simulation of the voltage at the output of the first LROC along the trace. Note that the output voltage is substantially distorted, emphasizing the importance of maintaining the proper distance between adjacent LROCs 44. This simulation, as well as all other simulations described herein (e.g., the graphs of FIGS. 11-25) were performed using Mathcad, a mathematical simulation program.

FIGS. 11-18 show additional input and output eye patterns for embodiments of the invention having different simulated LROC 44 capacitances and different numbers of LROCs. These figures show the impact of these variations in LROC capacitance and numbers on an input 175 picosecond rise time. Each of these figures is further described in the Brief Description of the Drawings hereinabove. Note that for these figures the following geometric conditions were assumed: (a) the distance L between LROC 44 was assumed to be 505 mils, (b) the spacing the floating metallic structures 48 and the trace (i.e., "h" in FIG. 26) was assumed to be 4 mils, and (c) the overlap with a facing side of the trace 24 was assumed to be 54 mils.

FIG. 19 shows the increase in the 175 picosecond input rise time as a function of the number of LROCs 44 for LROC capacitances of 0.4 picofarads, 0.283 picofarads, and 0.184 picofarads, wherein the same geometric conditions as for FIGS. 11-18 were assumed.

FIG. 20 shows the increase in the rise times for 0 picosecond, 20 picosecond, 60 picosecond, 100 picosecond, 145 picosecond, and 200 picosecond input rise times, as a function of the number of LROCs 44 along a trace 24 having a length in the range of 12.5 inches, and for each LROC, an LROC capacitance of 0.4 picofarads, wherein the same geometric conditions as for FIGS. 11-18 were assumed. Note the graphs of FIG. 20 show that for very fast rise times at least five LROCs 44 yield the most dramatic increase in rise time, and as the number of LROCs substantially increases, the increase in rise time slowly reduces. Accordingly, it is believed that, at least in some embodiments, at least five LROCs should be spaced adjacent to the trace 24, and 25 to 35 RLOCs are likely to be the range for an upper limit on the number of LROCs along such a trace 24.

Figure 21:
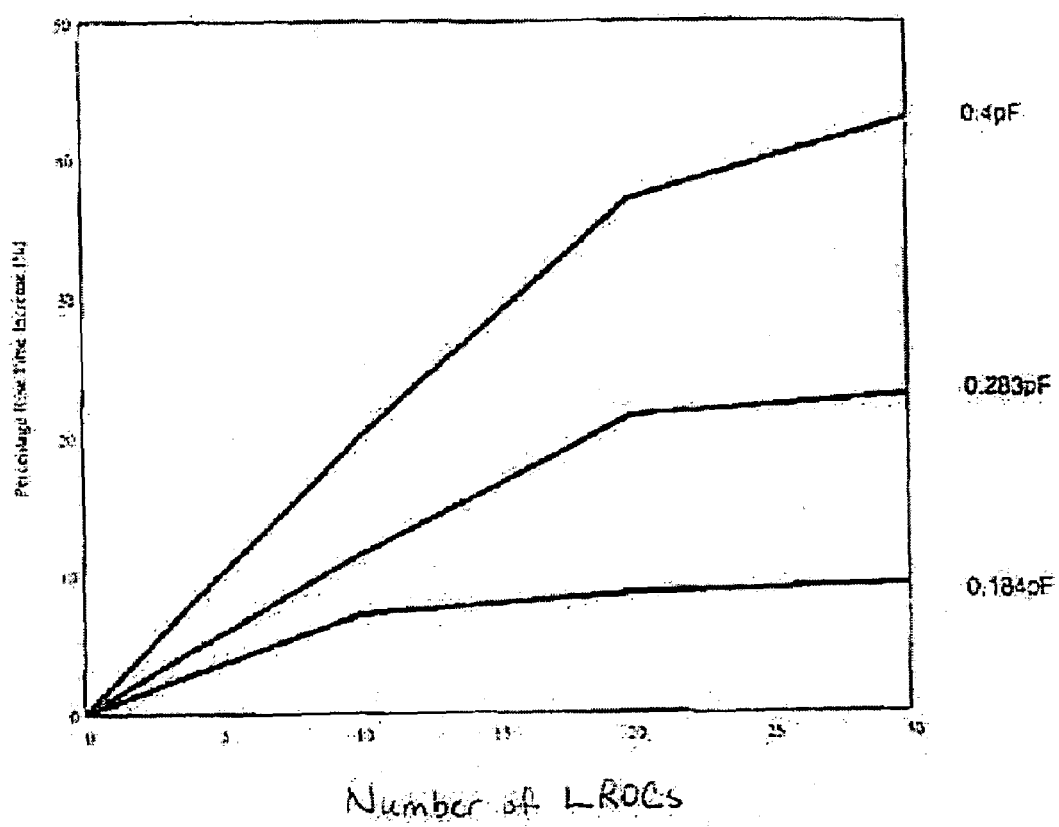
FIG. 21 shows simulated achievable percentage increases in the input 175 picosecond input rise time as a function of the number of identical LROCs and LROC capacitances of 0.4 picofarads, 0.283 picofarads, and 0.184 picofarads.

FIG. 21 shows the percentage increase of an input 175 picosecond rise time as a function of the number of LROCs 44 for LROC capacitances of: 0.4 picofarads, 0.283 picofarads, and 0.184 picofarads, wherein the same geometric conditions as for FIGS. 11-18 were assumed.

Figure 22:
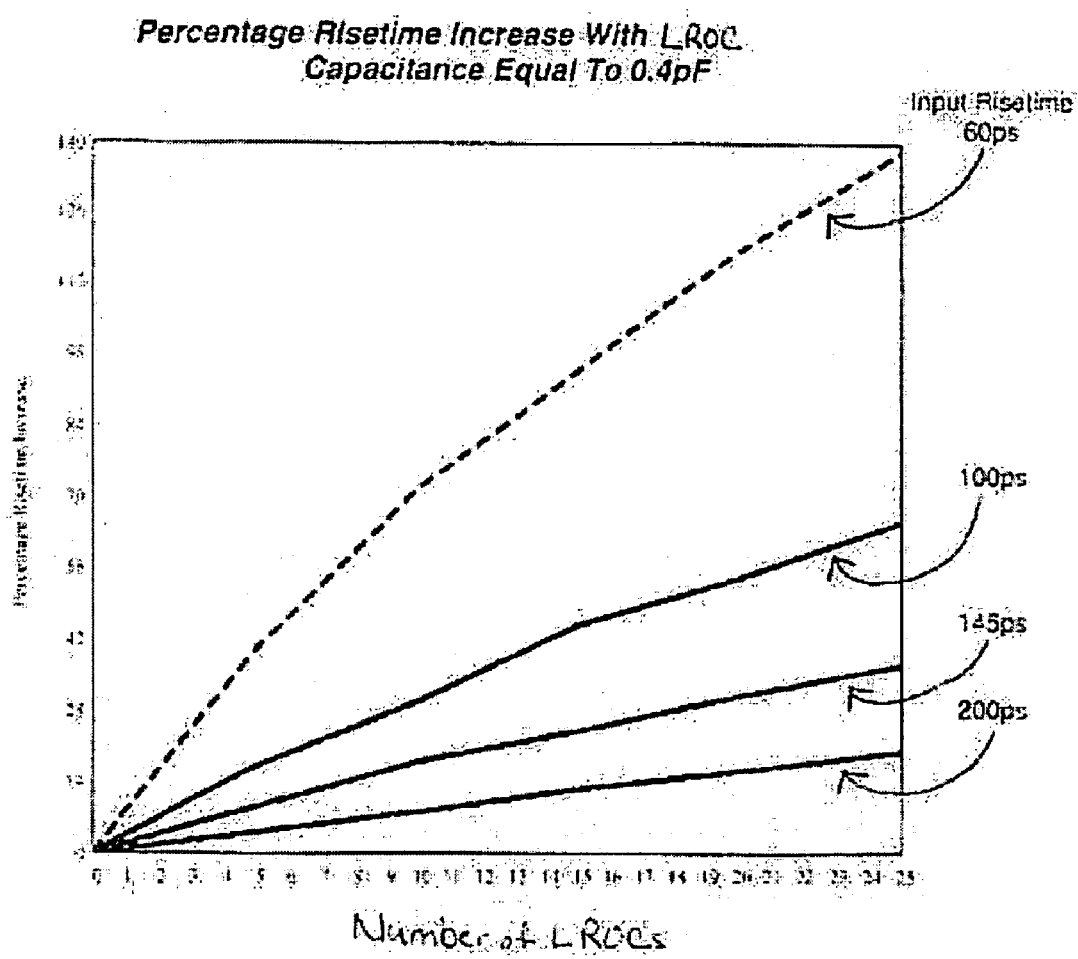
FIG. 22 shows simulated achievable percentage increases of the input rise times as a function of the number of identical LROCs, with the capacitance of each LROC equal to 0.4 picofarads. The input rise times are 60 picoseconds, 100 picoseconds, 145 picoseconds, and 200 picoseconds.

FIG. 22 shows the percentage increase of 60 picosecond, 100 picosecond, 145 picosecond, and 200 picosecond input rise times as a function of the number of LROCs 44 for an LROC capacitance of 0.4 picofarads, wherein the same geometric conditions as for FIGS. 11-18 were assumed.

Figure 23:
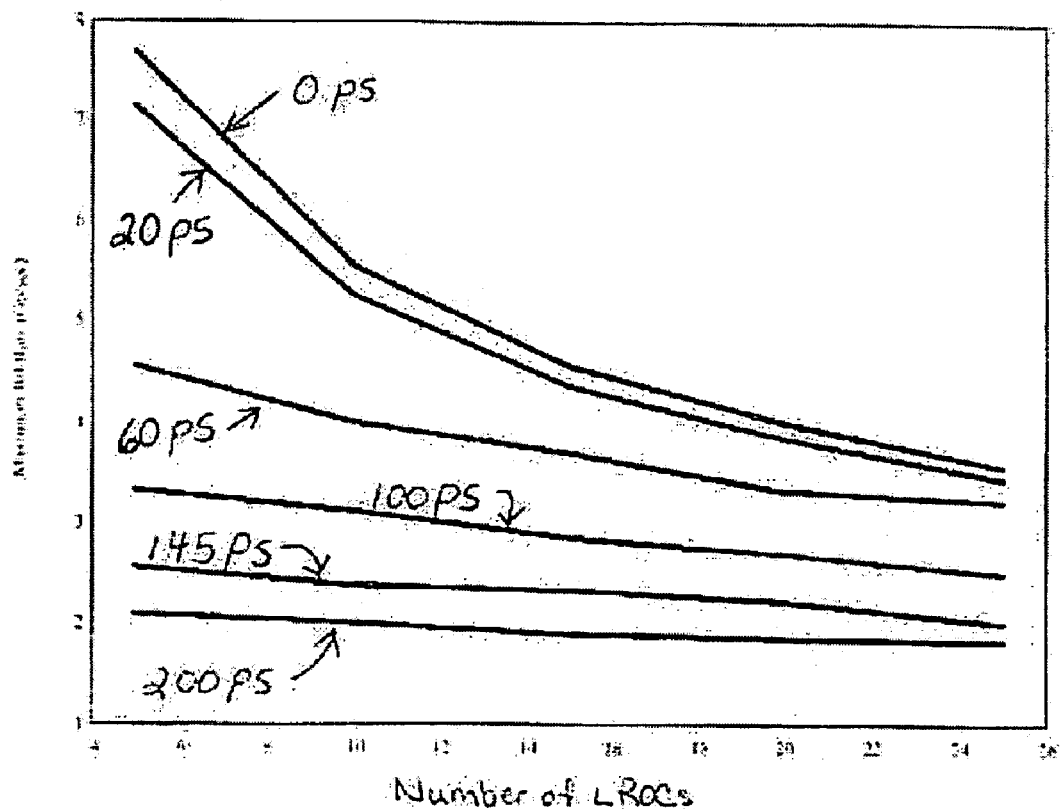
FIG. 23 shows the simulated achievable maximum bit rates as a function of the number of identical LROCs, with the capacitance of each LROC equal to 0.4 picofarads. The input rise times are 0 picoseconds, 20 picoseconds, 60 picoseconds, 100 picoseconds, 145 picoseconds, and 200 picoseconds.

FIG. 23 shows the achievable maximum Non-Return-To-Zero (NRZ) bit rates, as a function of the number of LROCs, for input NRZ pulses characterized with rise times of 0 picoseconds, 20 picoseconds, 60 picoseconds, 100 picoseconds, 145 picoseconds, and 200 picoseconds. Since the number of LROCs will limit the achievable maximum bit rate, this design information is important. The maximum achievable bit rate is defined to be the maximum bit rate that maintains the input noise margin at the output of the last LROC.

Figure 24:
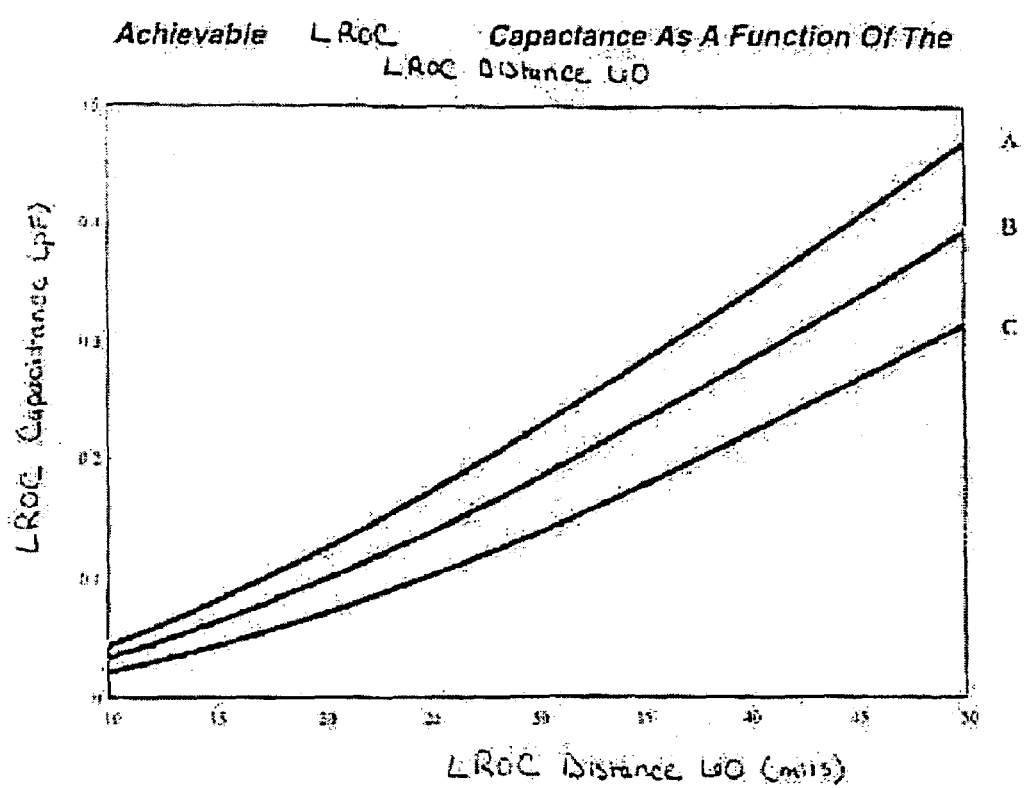
FIG. 24 shows the achievable LROC capacitances as a function of the length 60 of the floating metallic square structures (see FIG. 5) comprising each LROC. Cases A, B, and C pertain to different LROC configurations.

FIG. 24 shows the achievable LROC 44 capacitances for three different LROC configurations, as a function of the extent 60 (FIGS. 3 and 5) between LROCs. Curve C of FIG. 24 is for the LROC 44 configuration of FIG. 2, in which the single floating structure 48 is square shaped. Curve B of FIG. 24 is for an LROC 44 configuration whose components include those of FIG. 2, with the addition of two identical square floating structures 48, one on each side of the trace 24 (as opposed to the above and below the trace as in FIG. 4), and wherein each floating structure 48 is located 5 mils from the outer edge of trace 24. Curve A corresponds to an LROC whose components are shown in FIG. 6, wherein all floating structures 48 are square shaped and each floating structure is 5 mils from its nearest floating structure.

Figure 25:
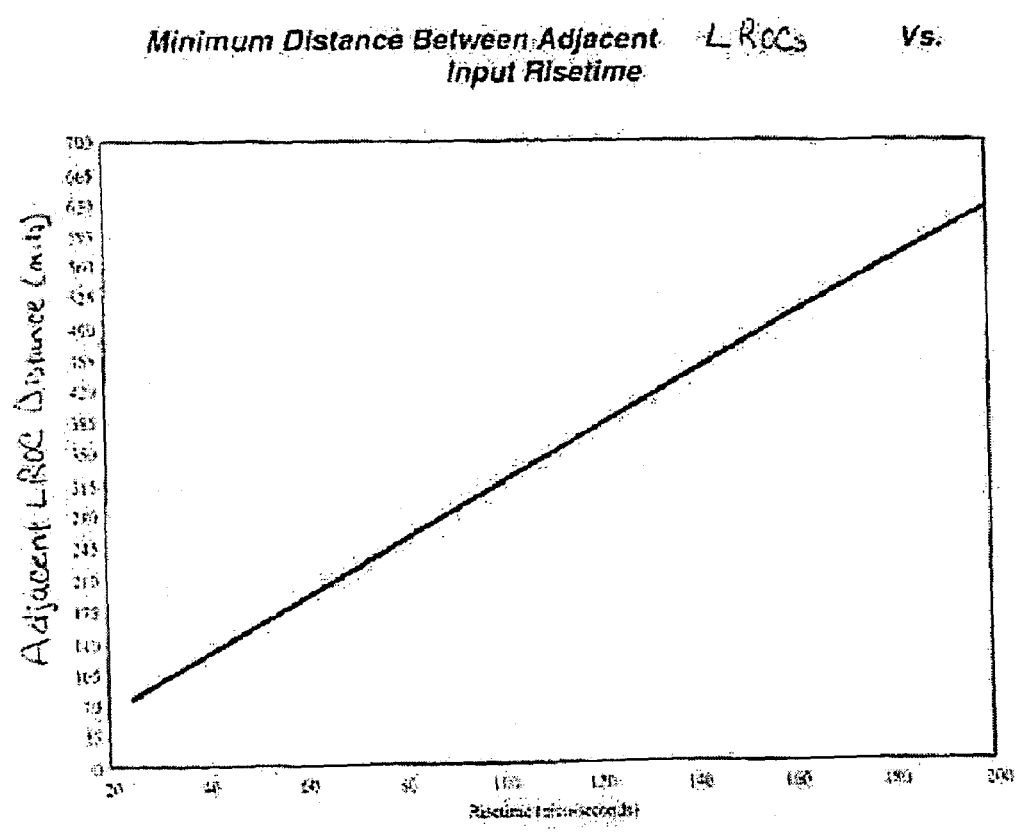
FIG. 25 shows preferred minimum distances between adjacent LROCs as a function of the input rise time for proper operation of the invention.

FIG. 25 shows the minimum distance between adjacent LROCs, as a function of the input rise time, in order for the present invention to operate in a best mode.

FIG. 26 shows a different embodiment of the proposed invention. In particular, the trace 24 includes expanded regions 120 that are adjacent and parallel to a corresponding one of the floating metallic structures 48 for thereby increasing the capacitance at each LROC 44. More particularly, there may be one of the expanded regions 120 adjacent to each (or most) of the floating metallic structures 48. Additionally, the integration of the expanded regions 120 into the trace 24 of FIG. 26 may substantially reduce the number of floating structures needed to achieve a given LROC 44 capacitance. In fact, each of these expanded regions 120 may only be adjacent to one of the reference planes 20 or 36, as shown in FIG. 1, and have no adjacent floating structures 48 whatsoever. In this later case, the LROC 44 capacitance is between each expanded region 120 and one of the reference planes 20 or 36. That is, the expanded regions 120 are effective for inducing a capacitance with at least one of the reference planes 20 or 36 so that high frequency noise signals do not continue on the trace 24, but instead migrate to the return currents 28 or 32 (FIG. 1) at the expanded regions.

Manufacturing of the present invention can be performed using currently available conventional PCB circuit board manufacturing techniques. In PCB circuit boards with a small number of layers (e.g., less than 6), the present invention may require the addition of at least one extra layer to provide the floating metallic structures 48 therein as in shown in FIG. 3. Moreover, additional layers may be needed to provide LROCs 44 as shown in FIGS. 5 or 6. In most PCB circuit boards that generate high frequency signals (e.g., above 2 gigahertz), there are likely to be a sufficient number of PCB layers (e.g., from 10 to 16 layers) already provided so that the LROCs 44 and their floating metallic structures 48 can be manufactured into pre-existing PCB layers.

The foregoing discussion of the invention has been presented for purposes of illustration and description. Further, the description is not intended to limit the invention to the form disclosed herein. Consequently, variation and modification commiserate with the above teachings, within the skill and knowledge of the relevant art, are within the scope of the present invention. The embodiment described hereinabove is further intended to explain the best mode presently known of practicing the invention and to enable others skilled in the art to utilize the invention as such, or in other embodiments, and with the various modifications required by their particular application or uses of the invention.

What is claimed is:

1. A method for reducing electromagnetic emissions from a computational device, comprising:
   providing within a substrate having a conductive trace, at least one capacitance region including a portion of said conductive trace and a conductive material, wherein said capacitance region operates, when signals having at least one of a rise time and a fall time in a range of approximately less than 200 picoseconds are transmitted on said trace, substantially as a capacitor for routing current from the trace toward another path in the substrate;
   wherein:
   (a1) said conductive material extends adjacently to said trace for a distance less than a length ($L_{Tr}$) of the trace required for carrying an entire signal corresponding to one of the rise time or the fall time; and
   (a2) said conductive material is electrically isolated from the trace.

2. The method of claim 1, wherein said capacitance region includes a conductive material that is approximately 2 to 5 mils from the trace.

3. The method of claim 1, wherein said substrate includes a dielectric material having a real relative dielectric permittivity greater than or equal to about 4.0 at a frequency of $1/(2t_r)$ Hertz, wherein $t_r$ is approximately the signal rise time.

4. The method of claim 1, wherein said distance is less than or equal to approximately 5.1 percent of the length $L_{Tr}$.

5. The method of claim 1, wherein said at least one capacitance region includes two or more capacitance regions adjacently spaced along a length of the trace such that:
   (a) each of the capacitance regions includes a conductive material that is electrically isolated from both: another one of the capacitance regions, and the trace; and
   (b) for two of said capacitance regions consecutively located along the trace, the two capacitive regions are spaced apart by at least a distance (D) related to the length $L_{Tr}$.

6. The method of claim 5, wherein said distance D is approximately greater than or equal to 52.0 percent of the length $L_{Tr}$.

7. The method of claim 5, wherein said two or more capacitance regions include at least five capacitance regions.

8. The method of claim 7, wherein said at least one capacitance region includes less than 35 capacitance regions.

9. The method of claim 5, wherein for each capacitance region (CR) of at least most of the two or more capacitance regions, CR is adjacent to an expanded region of the conductive trace.

10. The method of claim 1, wherein said conductive material includes one of copper, aluminum, silver, or gold.

11. The method of claim 1, wherein said providing step includes providing said conductive material so that said at least one capacitance region has an impedance effective for routing current having a signal frequency greater than 2 gigahertz to said conductive material.

12. The method of claim 1, wherein said conductive trace includes an expanded region that is adjacent to said at least one capacitance region.

13. An apparatus having reduced electromagnetic emissions, comprising:
   a substrate having a conductive trace;

at least one capacitance region adjacent to said conductive trace, said capacitance region including a portion of said conductive trace and a conductive material, wherein the at least one capacitance region operates, when signals having at least one of a rise time and a fall time in a range of approximately less than 200 picoseconds are transmitted on said trace, substantially as a capacitor for routing current from the trace toward another path in the substrate;

wherein:

(a1) said conductive material extends adjacently to said trace for a distance less than a length ($L_{Tr}$) of the trace required for carrying an entire signal corresponding to one of the rise time or the fall time;

(a2) when said capacitance region is operable, said current passes through said conductive material; and (a3) said conductive material is electrically isolated from the trace.

14. The apparatus of claim 13, wherein said capacitance region includes a conductive material that is approximately 2 to 5 mils from the trace.

15. The apparatus of claim 13, wherein said substrate includes a dielectric material having a real relative dielectric permittivity greater than or equal to about 4.0 at the frequency $1/(2t_r)$ Hertz, wherein $t_r$, is substantially the signal rise time.

16. The apparatus of claim 13, wherein said distance is less than or equal to 5.1 percent of the length $L_{Tr}$.

17. The apparatus of claim 13, wherein said at least one capacitance region includes two or more capacitance regions adjacently spaced along the length of the trace such that:

(a) each of the capacitance regions includes a conductive material that is electrically isolated from both: another one of the capacitance regions, and the trace; and (b) for two of said capacitance regions consecutively located along the trace, the two capacitive regions are spaced apart by at least a distance (D) related to the length $L_{Tr}$.

18. The apparatus of claim 17, wherein said distance D is approximately greater than or equal to 52.0 percent of the $L_{Tr}$.

19. The apparatus of claim 13, wherein said conductive material includes one of copper, aluminum, silver, or gold.

20. The apparatus of claim 13, wherein said providing step includes providing said conductive material so that said at least one capacitance region provides an impedance effective for routing current having a signal frequency greater than 2 gigahertz to said conductive material.

21. An apparatus having reduced electromagnetic emissions, comprising:

a substrate means for containing a conductive trace means, wherein the conductive trace means carries a conductive signal;

at least one capacitance region means adjacent to said conductive trace means, said at least one capacitance region including a portion of said conductive trace and a conductive material, wherein the at least one capacitance region means operates, when signals having at least one of a rise time and a fall time in a range of approximately less than 200 picoseconds are transmitted on said conductive trace means, substantially as a capacitor for routing current from the conductive trace means toward another path in the substrate means;

wherein:

(a1) extends adjacently to said trace for a distance less than a length ($L_{Tr}$) of the trace required for carrying an entire signal corresponding to one of the rise time or the fall time;

(a2) said current passes through a portion of said capacitance region different from said trace means; and (a3) said portion is electrically isolated from the trace.

* * * * *